(12) United States Patent
Imai

(10) Patent No.: US 10,892,353 B2
(45) Date of Patent: Jan. 12, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Tomohiro Imai, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/543,106

(22) Filed: Aug. 16, 2019

(65) Prior Publication Data
US 2020/0066887 A1 Feb. 27, 2020

(30) Foreign Application Priority Data
Aug. 24, 2018 (JP) .................. 2018-156892

(51) Int. Cl.
*H01L 29/739* (2006.01)
*H01L 29/417* (2006.01)
*H01L 29/66* (2006.01)

(52) U.S. Cl.
CPC .... *H01L 29/7397* (2013.01); *H01L 29/41708* (2013.01); *H01L 29/66348* (2013.01)

(58) Field of Classification Search
CPC ........... H01L 29/7397; H01L 29/41708; H01L 29/66348; H01L 29/407; H01L 29/7396; H01L 29/0619; H01L 29/42376; H01L 29/417; H01L 29/1095; H01L 29/0696
See application file for complete search history.

(56) References Cited

U.S. PATENT DOCUMENTS

| | | | |
|---|---|---|---|
| 5,721,148 A * | 2/1998 | Nishimura | .......... H01L 29/7827 438/270 |
| 9,842,919 B2 | 12/2017 | Matsuura | |
| 2012/0267750 A1* | 10/2012 | Imai | ................ H01L 21/823892 257/495 |
| 2014/0299917 A1* | 10/2014 | Narazaki | ............. H01L 29/0696 257/141 |
| 2016/0027906 A1* | 1/2016 | Onozawa | .......... H01L 29/66348 257/144 |
| 2018/0248008 A1* | 8/2018 | Sugawara | ........... H01L 29/1608 |
| 2018/0269318 A1* | 9/2018 | Kitada | ................ H01L 29/7397 |
| 2019/0006526 A1* | 1/2019 | Kitada | ............... H01L 29/66712 |
| 2019/0051739 A1* | 2/2019 | Naito | ................... H01L 29/1095 |
| 2019/0189756 A1* | 6/2019 | Okumura | ............ H01L 29/1095 |
| 2020/0091299 A1* | 3/2020 | Nakamata | ............. H01L 29/417 |
| 2020/0212209 A1* | 7/2020 | Nagata | ................ H01L 29/7397 |

FOREIGN PATENT DOCUMENTS

JP 2017-157733 A 9/2017

* cited by examiner

*Primary Examiner* — John P. Dulka
(74) *Attorney, Agent, or Firm* — McDermott Will & Emery LLP

(57) ABSTRACT

An IGBT with improved switching characteristics is disclosed. The contact hole CH1 in which the emitter potential electrode EE is buried is formed at a position overlapping with the trench T 1 in which the gate electrode G 1 is buried in plan view. The upper surface of gate electrode G1 in trench T1 is retracted, and an interlayer insulating film IL2 is formed on the top of trench T1. Since the bottom of the contact hole CH1 is located on the interlayer insulating film IL2 in the trench T 1 and in the base region PB, the emitter potential electrode EE is not in contact with the gate electrode G 1.

7 Claims, 30 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-156892 filed on Aug. 24, 2018 including the specification, drawings and abstract is incorporated herein by reference in its entirety.

BACKGROUND OF THE INVENTION

The present invention relates to a semiconductor device and its manufacturing method, and in particular, the present invention can be suitably applied to a semiconductor device including IGBT (Insulated Gate Bipolar Transistor).

As an IGBT having a low on-resistance, a trench gate type IGBT is widely used, and an IE type IGBT has been developed in which an IE (Injection Enhancement) effect can be utilized by alternately arranging an active cell region having a gate electrode connected to a gate potential electrode, an emitter region, and a base region, and an inactive cell region including a p-type floating region. The IE effect is an effect of increasing the density of charges accumulated in the drifting areas by making it difficult for holes to be discharged from the emitter potential electrodes when the IGBT is on state.

As such an IE-type IGBT, a GG structure in which two adjacent trench gates are connected to a gate potential, a GGEE structure in which two adjacent trench gates are connected to an emitter potential in addition to the GG structure, and the like have been developed. In the GGEE structure, a parasitic p-type MOSFET (Metal Oxide Semiconductor Field Effect Transistor) is formed by a trench gate connected to an emitter potential, and holes are discharged by the parasitic p-type MOSFET, thereby suppressing potential fluctuations in floating regions between the GG structure and the EE structure.

For example, Japanese Lead-open Patent Application No. 2017-15533 (Patent Document 1) discloses a technique for making the widths of two trench gates connected to an emitter potential smaller than the widths of two trench gates connected to a gate potential in an IE-type IGBT of GGEE structures. As a result, in the hole collector cell region formed by the EE structure, the body region between the two trench gates and the two trench gates can be connected by one emitter potential contact hole.

SUMMARY OF THE INVENTION

The inventors of the present application have considered to improve the performance of the semiconductor device by shrinking the cells and reducing the on-voltage in a GGEE structure. However, when shrinking a cell with a GGEE structure, it is difficult to form a contact hole for an emitter potential in an active cell area formed with a GG structure.

In the conventional GG structure, the contact hole for the emitter potential needs to be formed at a position that fits within the mesa width of the active cell region (i.e., the width of the semiconductor region between two trench gates connected to the gate potential). In the hole collector cell region, there is no problem even if a contact hole for emitter potential is connected to the trench gate of the hole collector cell region. On the other hand, since the gate potential is connected to the trench gate of the active cell region, the contact hole for the emitter potential must not be connected to the trench gate of the active cell region.

In addition, when shrinking of the cell is performed, the number of trenches in the semiconductor chip can be increased, but the gate capacitance increases as the trench density increases. Therefore, it is desired to suppress deterioration of the switching characteristics due to increases in the input capacitance Cies and the feedback capacitance Cres.

Other objects and novel features will become apparent from the description of this specification and the accompanying drawings.

Means of Solving the Problems

The typical ones of the embodiments disclosed in the present application will be briefly described as follows.

The semiconductor device according to one embodiment has a first trench and a second trench formed in a semiconductor substrate, extending in a first direction in plan view, and adjoining each other in a second direction perpendicular to the first direction in plan view, and has a first base region of a first conductivity type formed in a semiconductor substrate sandwiched between the first trench and the second trench. The semiconductor device also has a first emitter region of a second conductivity type opposed to the first conductivity type, formed in the base region, a first contact hole formed in the first emitter region and the first base region, and an emitter potential electrode formed in the first contact hole and in contact with the first emitter region and the first base region. Here, a first gate electrode connected to a gate potential is formed in the first trench, a first insulating film is formed in the second trench, the first contact hole is formed at a position overlapping the second trench in plan view, and the bottom of the first contact hole is located on the first insulating film in the second trench and in the first base region.

According to one embodiment, the performance of the semiconductor device can be improved.

DETAILED DESCRIPTION OF THE EMBODIMENTS

Figure 1:
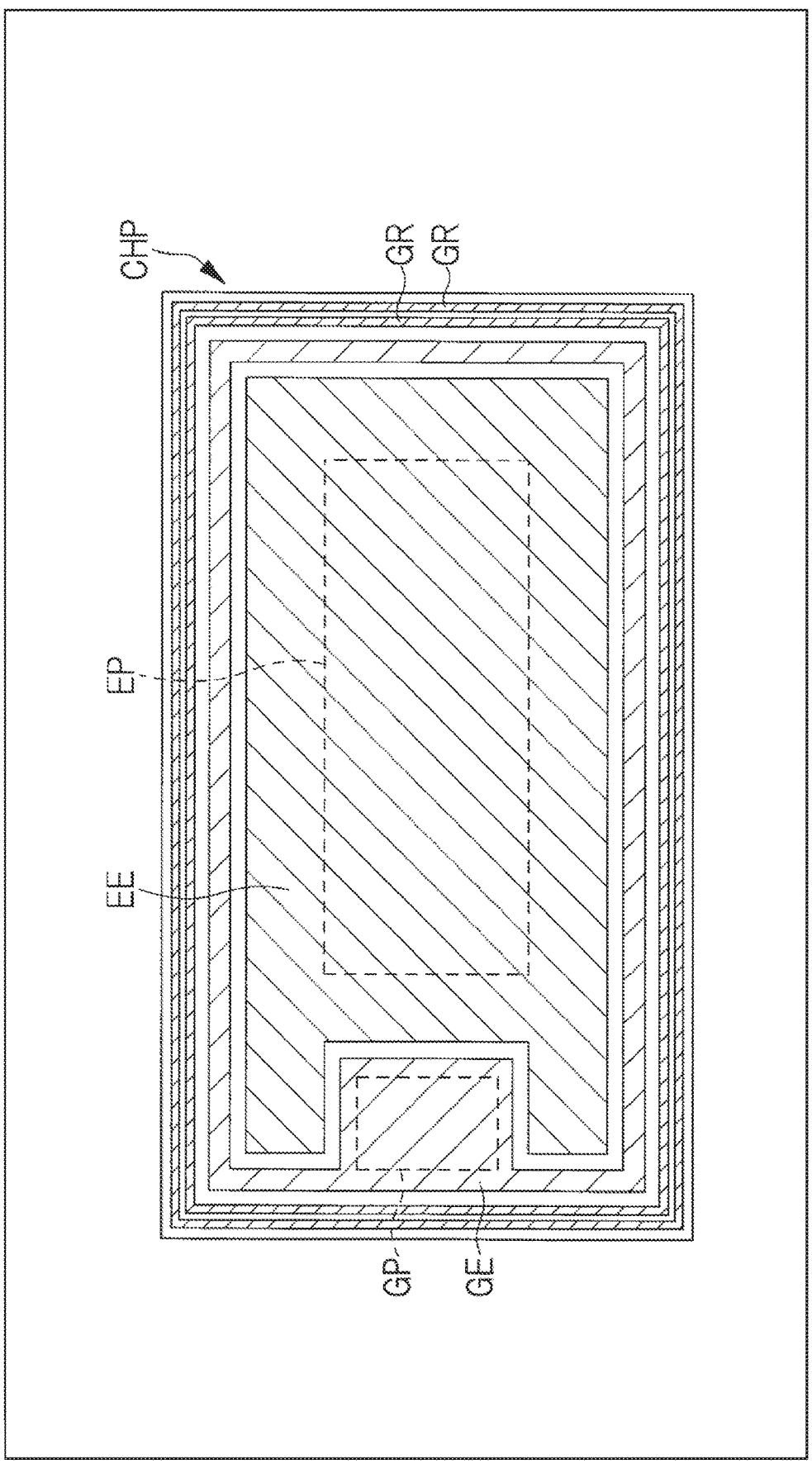
FIG. 1 is a plan view of a semiconductor chip according to a first embodiment.

In the following embodiments, when required for convenience, the description will be made by dividing into a plurality of sections or embodiments. But except when specifically stated, they are not independent of each other, and one is a part of the other, or all of the other modifications, or is related to details or supplementary description. In the following embodiments, the number of elements, including the number of elements, numerical values, quantities, ranges etc., is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

In addition, in the present specification, the conductivity type of the semiconductor is p-type, which means that only holes are charge carriers, or both electrons and holes may be charge carriers, but the concentration of holes is higher than the concentration of electrons, and holes are the main charge carriers. In addition, in the present specification, the conductivity type of the semiconductor is n-type, which means that only electrons are charge carriers, or both electrons and holes may be charge carriers, but the concentration of electrons is higher than the concentration of holes, and electrons are the main charge carriers.

In this specification, the switching operation in which the IGBT is switched from the off state to the on state is referred to as "turn-on", and the switching operation in which the IGBT is switched from the on state to the off state is referred to as "turn-off".

Embodiment 1

The semiconductor device of present embodiment will be described in detail below with reference to the drawings. The semiconductor device of the present first embodiment is a semiconductor device with an IE-type IGBT of a new structure developed using a GGEE type structure as a basic structure.

<Configuration of Semiconductor Device>

FIG. 1 is a plan view of a semiconductor chip CHP that is a semiconductor device of present embodiment. Although FIG. 1 is a plan view, the gate potential electrode GE, the emitter potential electrode EE, and the guard ring GR are hatched in order to make the drawing easier to see.

As shown in FIG. 1, most of the semiconductor chips CHP are covered with the emitter potential electrode EE, and main semiconductor elements such as a IGBT are formed below the emitter potential electrode EE. A gate potential electrode GE is formed on the outer periphery of the emitter potential electrode EE, and a guard ring GR is formed on the outer periphery of the gate potential electrode GE. A region surrounded by a broken line in the vicinity of the center portion of the emitter potential electrode EE is an emitter pad EP, and a region surrounded by a broken line of the gate potential electrode GE is a gate pad GP. External connecting terminals such as wire bonds or clips (copper plates) are connected to the emitter pads EP and the gate pads GP, so that the semiconductor chip CHP can be electrically connected to another chip, a wiring substrate, or the like.

Figure 2:
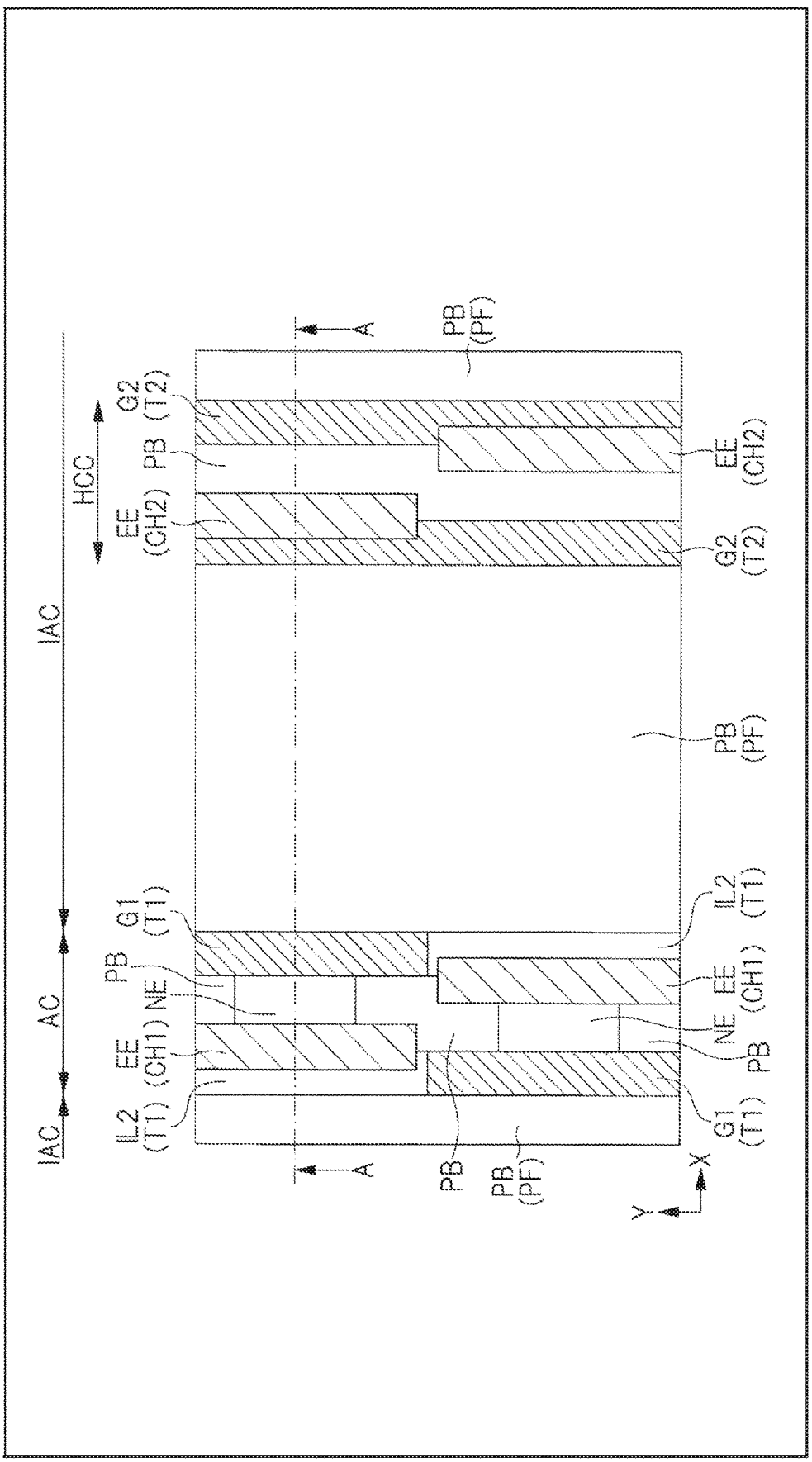
FIG. 2 is a plan view of a main part of a semiconductor device according to a first embodiment.
Figure 3:
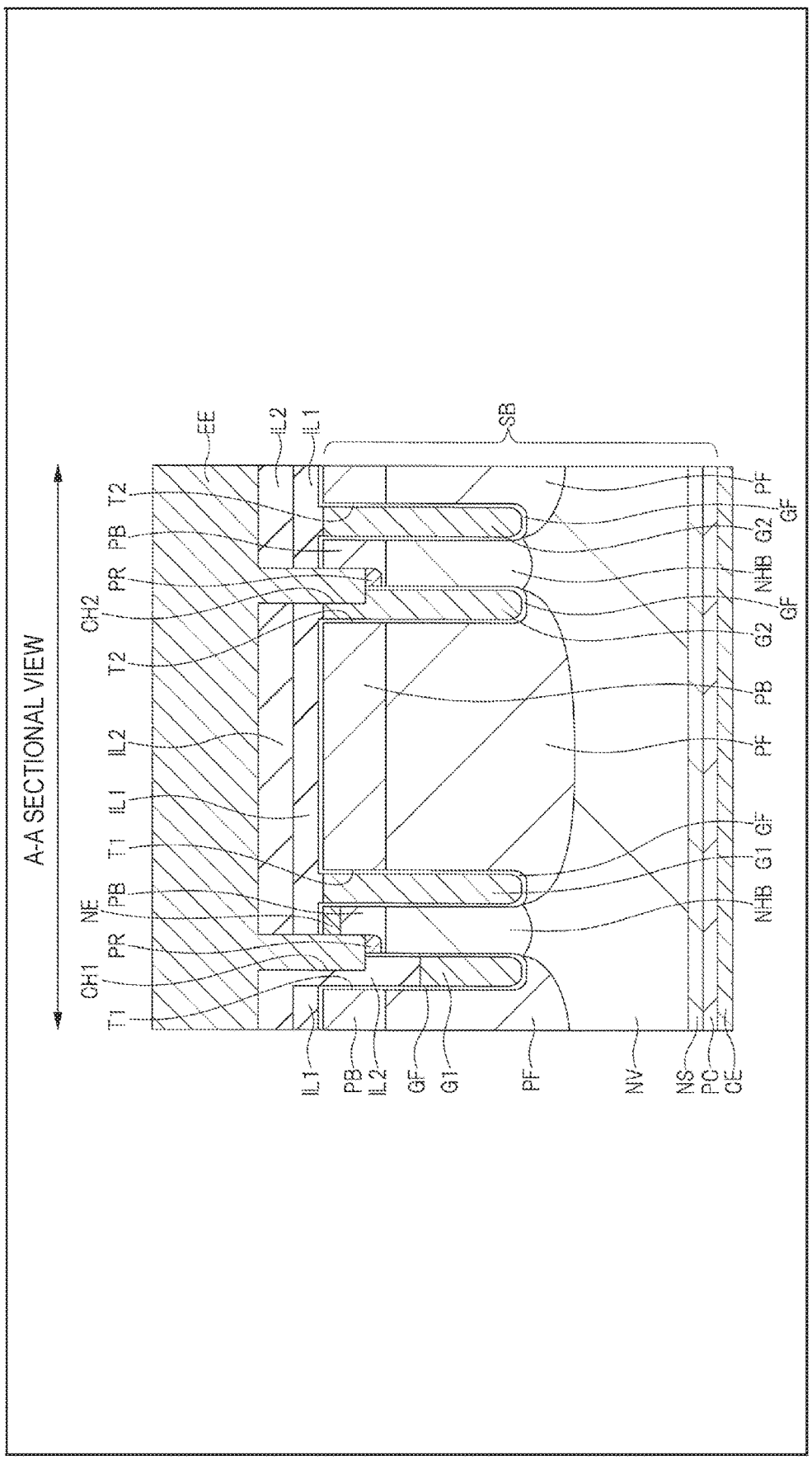
FIG. 3 is a cross-sectional view of the semiconductor device according to the first embodiment.

FIG. 2 shows a main portion plan view of the semiconductor chip CHP, which corresponds to the plan view below the emitter-potential electrodes EE. FIG. 3 is a cross-sectional view along line A-A shown in FIG. 2. Although FIG. 2 is a plan view, the gate electrode G 1, the gate electrode G 2, and the emitter-potential electrode EE are hatched.

The semiconductor device of the present embodiment has an active cell region AC having a gate electrode G 1, which is a trench gate electrically connected to the gate potential electrode GE, and a region surrounded by two gate electrodes G 1, and an inactive cell region IAC other than the active cell region AC. A hole collector cell region HCC having a gate electrode G 2 which is a trench gate electrically connected to the emitter potential electrode EE and a region surrounded by two gate electrodes G 2 is formed in the inactive cell region IAC, and a base region (impurity region) PB and a floating region (impurity region) PF are formed around the hole collector cell region HCC.

The active cell region AC is a region constituting a main circuit of the IGBT in the present embodiment. In the active cell region AC, as shown in FIG. 2, two trenches T 1 extend in the Y direction, and the two trenches T 1 are arranged adjacent to each other in the X direction orthogonal to the Y direction. As shown in FIG. 3, although the gate electrode G 1 is buried in the trench T 1, in a part of the trench T 1, the gate electrode G 1 is buried in the lower portion of the trench T 1, and the interlayer insulating film IL2 is buried in the upper portion of the trench T 1. Although not shown, the gate electrode G 1 is electrically connected to the gate potential electrode GE shown in FIG. 1, and a gate potential is applied to the gate electrode G 1 during the operation of the IGBT.

In the X-direction, a p-type base area PB is formed on the surface of the semiconductor substrate SB in the region sandwiched between the two trenches T 1, and a plurality of n-type emitter regions NEs are formed on the surface of the base region PB.

The emitter regions NE and the base regions PB are in contact with the contact holes CH1 extending in the Y-direction, and the emitter potential electrodes EE are buried in the contact holes CH1. A p-type body region PR having an impurity density higher than that of the base region PB is formed in the semiconductor substrate SB below the contact hole CH1. Therefore, during the operation of the IGBT, an emitter potential is applied to the emitter region NE, the base region PB, and the body region PR.

In the Y direction, the emitter regions NE are not formed on the entire surface of the base region PB, and a plurality of emitter regions NE are arranged at regular intervals. That is, the plurality of emitter regions NE are formed so as to be separated from each other in the Y direction by the base region PB.

The contact hole CH1 is formed at a position overlapping with one of the trenches T 1 in plan view. However, an interlayer insulating film IL2 is formed above the trench T 1 at this position. Therefore, the emitter potential electrode EE formed in the contact hole CH1 is not in contact with the gate electrode G 1 formed in the trench T 1.

The inactive cell region IAC is a region other than the active cell region AC and has no emitter region NE in the base region PB. Most of the inactive cell region IAC is a floating region PF in which a base region PB is formed on its surface, but a hole collector cell region HCC is formed in a part of the inactive cell region IAC. That is, a floating region PF is formed between the active cell region AC and the hole collector cell region HCC adjacent to each other in the X direction.

In the hole collector cell region HCC, as shown in FIG. 2, two trenches T 2 extend in the Y direction, and the two trenches T 2 are arranged adjacent to each other in the X direction orthogonal to the Y direction. A gate electrode G 2 is buried in the trench T 2.

The p-type base region PB is formed on the surface of the semiconductor substrate SB in the region sandwiched between the two trenches T 2, but unlike the active cell region AC, the n-type emitter region NE is not formed on the surface of the base region PB of the hole collector cell region HCC.

The base region PB is in contact with the contact hole CH2 extending in the Y-direction, and the emitter potential electrodes EE are buried in the contact hole CH2. A p-type body region PR having an impurity density higher than that of the base region PB is formed in the semiconductor substrate SB below the contact hole CH2.

The contact hole CH2 is formed at a position overlapping with one of the trenches T 2 in plan view. Therefore, the emitter potential electrode EE formed in the contact hole CH2 is in direct contact with the gate electrode G 2 formed in the trench T 2. Therefore, in the hole collector cell region HCC, an emitter potential is applied to the gate electrode G 2, the base region PB, and the body region PR during the operation of the IGBT.

In present embodiment, the widths of the active cell region AC and the hole collector cell region HCC in the X-direction are 2 µm or less, for example, 1 µm. The width of the active cell region AC may be different from the width of the hole collector cell region HCC. The width of the floating region PF between the active cell region AC and the hole collector cell region HCC is 1 to 6 µm, for example, 3 µm.

Next, a cross-sectional configuration of the semiconductor device of the present embodiment will be described with reference to FIG. 3.

In the semiconductor substrate SB, a drift region NV, which is a low-concentration n-type impurity region, is formed. On the back surface of the semiconductor substrate SB, an n-type field stop region (impurity region) NS having an impurity concentration higher than that of the drift region NV, a p-type collector region (impurity region) PC, and collector potential electrodes CE made of a metallic film are formed. During the operation of the IGBT, a collector voltage is applied to the collector regions PC via the collector potential electrodes CE.

Trenches T 1 and T 2 are formed on the front surfaces of the semiconductor substrate SBs. The depth of each of the trenches T 1 and T 2 is 2 to 5 µm, for example, 3 µm. A gate electrode G 1 and a gate electrode G 2 are buried in the trench T 1 and the trench T 2, respectively, via the gate dielectric film GF. As described above, the gate electrode G 1 is electrically connected to the gate potential electrode GE, and the gate potential is applied to the gate electrode G 1 during the operation of the IGBT. The gate electrode G 2 is connected to the emitter potential electrode EE, and an emitter potential is applied to the gate electrode G 2 during the operation of the IGBT. The gate dielectric film GF is, for example, a silicon oxide film, and the gate electrode G 1 and the gate electrode G 2 are, for example, polycrystalline silicon films into which an n-type impurity is introduced.

In one of the two trenches T 1, the gate electrode G 1 is formed below the trench T 1, and the interlayer insulating film IL2 is formed above the trench T 1.

A p-type floating region PF is formed in the semiconductor substrate SB between the gate electrode G 1 and the gate electrode G 2, and a p-type base region PB is formed on the surface of the floating region PF. In order to prevent a drop in breakdown voltage due to concentration of an electric field around the bottom of the trench T 1 and the bottom of the trench T 2, the floating region PF is preferably formed to a position deeper than the bottom of the trench T 1 and the bottom of the trench T 2, and is more preferably formed to cover the bottom of the trench T 1 and the bottom of the trench T 2.

A hole barrier region NHB having an impurity density higher than that of the drift region NV is formed in the semiconductor substrate SB between the two gate electrodes G 1 and the semiconductor substrate SB between the two gate electrodes G 2, and a p-type base region PB is formed on the surface of the hole barrier region NHB. The hole barrier region NHB is mainly provided to improve the hole accumulation effect, thereby improving the IE effect.

An n-type emitter region NE having an impurity concentration higher than that of the hole barrier region NHB is formed in the p-type base region PB (p-type base region PB of the active cell region AC) between the two gate electrodes G 1, but the emitter region NE is not formed in the p-type base region PB (p-type base region PB of the hole collector cell region HCC) between the two gate electrodes G 2.

An interlayer insulating film IL1 is formed on the upper surface of each of the emitter region NE, the base region PB, the gate electrode G 1, and the gate electrode G 2. An interlayer insulating film IL2 is formed on the interlayer insulating film IL1. The interlayer insulating film IL1 and the interlayer insulating film IL2 are, for example, silicon oxide films. The contact hole CH1 and the contact hole CH2 are formed so as to penetrate the interlayer insulating film IL2, the interlayer insulating film IL1, and the gate dielectric film G F and reach the inside of the semiconductor substrate S B.

In the active cell region AC, the contact hole CH1 is formed so as to penetrate the emitter region NE and reach the base region PB. In plan view, the contact hole CH1 is formed at a position overlapping with one of the two trenches T 1. As described above, in one trench T 1, the gate electrode G 1 is formed below the trench T 1, and the interlayer insulating film IL2 is formed above the trench T 1. Therefore, the bottom of the contact hole CH1 is located on the interlayer insulating film IL2 in the trench T 1 and in the base region PB without contacting the gate electrode G 1.

In the hole collector cell region HCC, the contact hole CH2 is formed to reach the base region PB. In plan view, the contact hole CH2 is formed at a position overlapping with one of the two trenches T 2. Therefore, the bottom of the contact hole CH2 is in direct contact with the gate electrode G 2, and is located on the gate electrode G 2 in the trench T 2 and in the base region PB.

The bottoms of the contact holes CH1 and CH2 are disposed in the base region PB, and do not reach the hole barrier region NHB. A p-type body region PR having an impurity density higher than that of the base region PB is formed around the bottom portions of the contact holes CH1 and CH2. The body region PR is provided as a part of the base region PB, and is provided in order to lower the contact resistance with the emitter potential electrodes EE buried in the contact holes CH1 and CH2 and to prevent latch-up of the emitter potential electrodes EE.

An emitter potential electrode EE is formed on the interlayer insulating film IL2, and the emitter potential electrode EE is buried in the contact hole CH1 and the contact hole CH2. Therefore, in the active cell region AC, an emitter potential is applied to the emitter region NE, the base region PB, and the body region PR, and in the hole collector cell region HCC, an emitter potential is applied to the gate electrode G 2, the base region PB, and the body region PR. Note that the contact hole CH1 and the contact hole CH2 are not disposed in the floating region PF of the inactive cell region IAC, so that potentials such as the emitter potential and the gate potential are not applied to the floating region PF of the inactive cell region IAC.

The hole collector cell region HCC is provided mainly for performing a parasitic p-type MOSFET operation and discharging holes accumulated in the vicinity of the p-type floating region PF. The parasitic p-type MOSFET operates by a hole current flowing through a portion of the n-type drift region NV, the p-type floating region PF, the n-type hole barrier region NHB, and the p-type base region PB near the bottom portion of the trench T 2 by a current path passing through the portion of the p-type floating region PF, the n-type hole barrier region NHB, and the p-type base region PB from the n-type drift region NV. That is, the parasitic p-type MOSFET is configured by using the gate electrode G 2 connected to the emitter potential electrode EE as a gate, using the p-type floating region PF as a source, using the p-type base region PB as a drain, and using the n-type hole barrier region NHB as a channel. As a result, when the IGBT is turned on, holes existing around the bottom of the trench T 2 are discharged as carriers. Therefore, the potential variation of the floating region PF can be suppressed.

The main features of the semiconductor device of present embodiment will be described below.

First, in present embodiment, the distance between the two gate electrodes G1 to which the gate potential is applied is narrowed in the active cell region AC compared to a conventional structure such as, for example, Patent Document 1. Thereby, since the active cell area AC can be shrunk, the semiconductor device can be miniaturized. Since the IE effect can be improved by shrinking the active cell area AC, the on-voltage of the IGBT can be reduced. That is, the performance of the semiconductor device can be improved.

Figure 4:
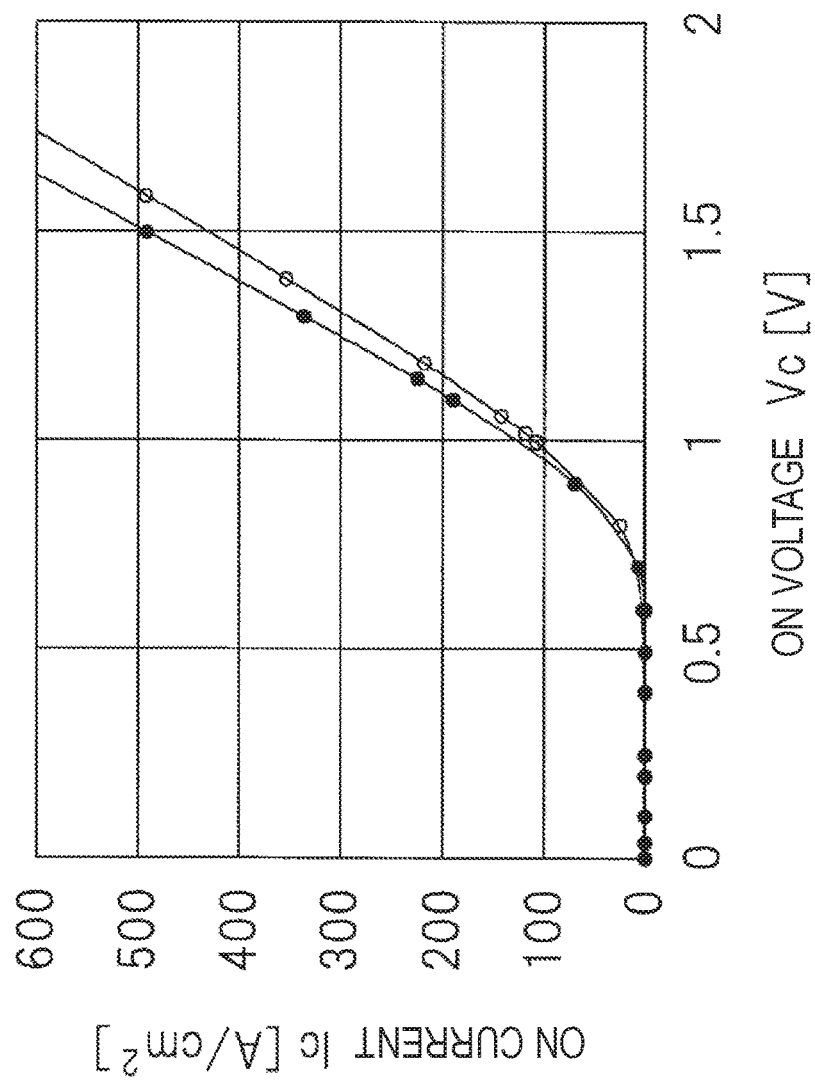
FIG. 4 is a graph showing the results of experimentation by the present inventor.

FIG. 4 is a graph showing the results of experiments conducted by the inventors of the present application. Here, the voltage of the gate electrode G1 is fixed at 15V, and the on-voltage Vc and on-current Ic per unit area are evaluated by 3D-TCAD. The symbol ○ (white circle) in the drawing is a semiconductor device of a conventional construction as in the Patent Document 1, and the symbol ● (black circle) in the drawing is a semiconductor device of present embodiment. As can be seen from FIG. 4, in the case of present embodiment (circled mark), for example, when the on-state current Ic is in the 2 of 300 to 500 A/cm, the on-state voltage Vc can be lowered by about 0.08 to 0.11 V.

Further, in performing this shrinkage, as shown in FIG. 2, in plan view, the contact hole CH1 is formed at a position overlapping with one of the two trenches T 1, and the contact hole CH2 is formed at a position overlapping with one of the two trenches T 2. Here, in the hole collector cell area HCC, there is no problem even if the contact hole CH2 in which the emitter potential electrode EE is formed and the gate electrode G 2 to which the emitter potential is applied are in contact with each other. However, in the active cell area AC, since the gate potential is applied to the gate electrode G 1, the contact hole CH1 in which the emitter-potential electrode EE is formed and the gate electrode G 1 should not be in contact with each other.

Therefore, as shown in FIG. 3, in the present embodiment, in a part of the trench T 1, the gate electrode G 1 formed in the trench T 1 is retreated, and an interlayer insulating film IL2 serving as an insulating film is formed on the upper portion of the trench T 1. Therefore, in the area where the contact hole CH1 and the trench T 1 overlap in plan view, the bottom portion of the contact hole CH1 is located on the interlayer insulating film IL2 in the trench T 1. Therefore, the gate electrode G 1 does not come into contact with the emitter potential electrode EE.

As described above, in the present embodiment, the semiconductor device performance can be improved and the semiconductor device can be miniaturized, but the trench densities per chip-unit area increase with shrinkage. This also increases the capacitance of the input capacitance Cies and the like. When the input capacitance Cies increases, the switching characteristics at the time of turn-on deteriorate. Here, the input capacitance Cies of the IGBT is composed of the gate-emitter capacitance Cge, the gate-collector capacitance Cgc, and the collector-emitter capacitance Cce, and is expressed by the following equation (1).

$$Cies=Cge+Cgc;\qquad\text{equation (1)}$$

Gate-emitter capacitance Cge is large because the depletion layer is scarce between the gate emitters. On the other hand, since the depletion layer spreads between the gate and collector, the capacitance Cgc between the gate and collector is small. Therefore, the increase of the input capacitance Cies is greatly affected by the increase of the input capacitance Cge.

As described above, in the present embodiment, the gate electrode G 1 formed in the trench T 1 is recessed in the region overlapping with the contact hole CH1 in plan view. As a result, since the capacitance Cge is reduced, it is possible to suppress an increase in the input capacitance Cies. Therefore, deterioration of the switching characteristics can be suppressed.

Another characteristic of the present embodiment in plan view is that, as shown in FIG. 2, the contact holes CH1 are alternately arranged in the active cell regions AC in a staggered manner in the active cell regions AC. That is, in the Y-direction, the trench T 1 has a first portion (on the upper side of the drawing) where the interlayer insulating film IL2 is formed in one trench T 1 and the gate electrode G 1 is formed in the other trench T 1, and a second portion (on the lower side of the drawing) where the gate electrode G 1 is formed in one trench T 1 and the interlayer insulating film IL2 is formed in the other trench T 1. The first and second portions are alternately arranged in the Y direction. In other words, in the active cell area AC, the portions where the interlayer insulating film IL2 is formed in the trench T 1 and the portions where the emitter potential electrodes EE are formed in the contact holes CH1 are arranged in a staggered arrangement.

With such a staggered arrangement, since the entrances of electrons and holes are dispersed in the active cell region AC, the heat due to the current is not concentrated at a specific location. Therefore, the thermal fracture resistance of the IGBT can be improved.

When wire bonding of gold, copper, or the like is formed on the emitter pad EP of the emitter potential electrode EE, if the contact holes CH1 are formed in stripes, the wire bonding may easily be peeled off from the emitter potential electrode EE. That is, if a portion of the emitter pad EP on the contact hole CH1 is weak in the stress at the time of bonding due to the effect of the Ultra Sonic dependency, the entire upper portion of the stripe-shaped contact hole CH1 may be continuously weak in the stress. Since the contact holes CH1 are staggered as in present embodiment, even if there is a portion of the emitter pad EP on the contact hole CH1 which is vulnerable to stress, other portions of the emitter pad EP are not affected by the portion which is vulnerable to stress. Therefore, since the influence of the dependency in the US direction is reduced, the peeling can be suppressed.

It is preferable that such a staggered arrangement is performed not only in the active cell region AC but also in the hole collector cell region HCC. As a result, the thermal fracture resistance and the suppression of peeling can be further improved.

The manufacturing method of the semiconductor device of the present embodiment will be described below with reference to FIGS. 5 to 15. FIGS. 5 to 15 are manufacturing steps of the section A-A shown in FIG. 2.

Figure 5:
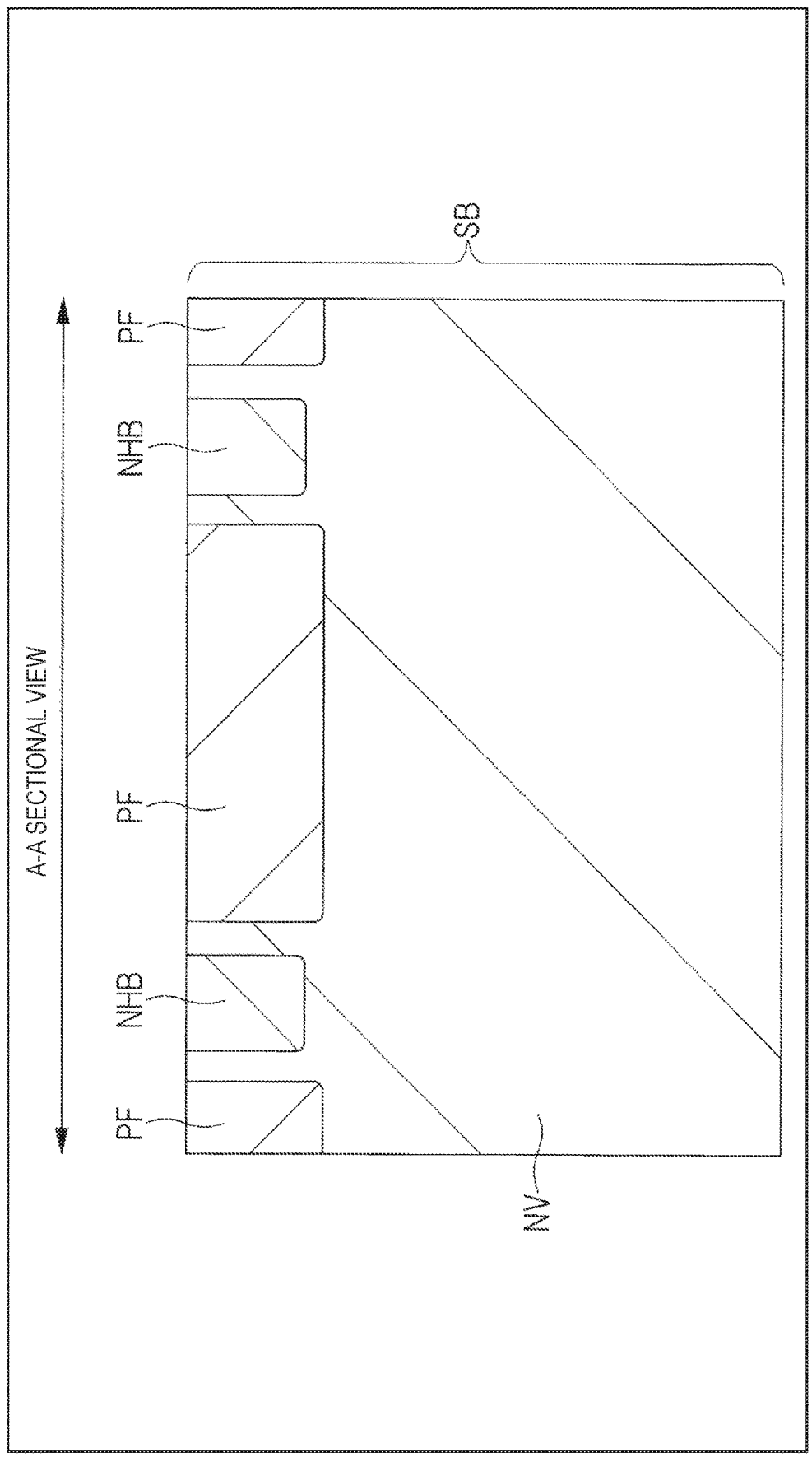
FIG. 5 is a cross-sectional view of a manufacturing process of the semiconductor device according to the first embodiment.

FIG. 5 shows a process of forming the drift region NV, the hole barrier region NHB, and the floating region PF.

First, n-type drift regions NVs are formed in the semiconductor substrate SBs. The drift region NV is formed by preparing a semiconductor substrate SB into which an n-type impurity is introduced in advance and using the n-type semiconductor substrate SB as the drift region NV, or a p-type semiconductor substrate SB is prepared and formed on the p-type semiconductor substrate SB by an epitaxial method. In present embodiment, the drift region NV may be described as a semiconductor substrate SB.

Next, an n-type hole barrier region NHB and a p-type floating region PF are formed on the surface of the drift region NV by photolithography and ion implantation. The hole barrier region NHB has an impurity concentration higher than that of the drift region NV.

The impurity for forming the hole barrier region NHB is, for example, phosphorus (P), and the ion implantation is performed under the condition that the dose is about $5 \times 10^{12}$ per cm 2 to $2 \times 10^{13}$ per cm 2 and the energy is 300 keV or more. The ion implantation may be performed in a plurality of times, and in this case, the ion implantation is performed within a range of 500 to 2500 keV. The impurity for forming the floating regions PF is boron (B), for example, and the ion implantation is performed under the condition that the dose is about $4 \times 10^{13}$ per cm 2 and the energy is 75 keV or more. The ion implantation may be performed in a plurality of times, and in this case, the ion implantation is performed within a range of 200 to 1500 keV.

Figure 6:
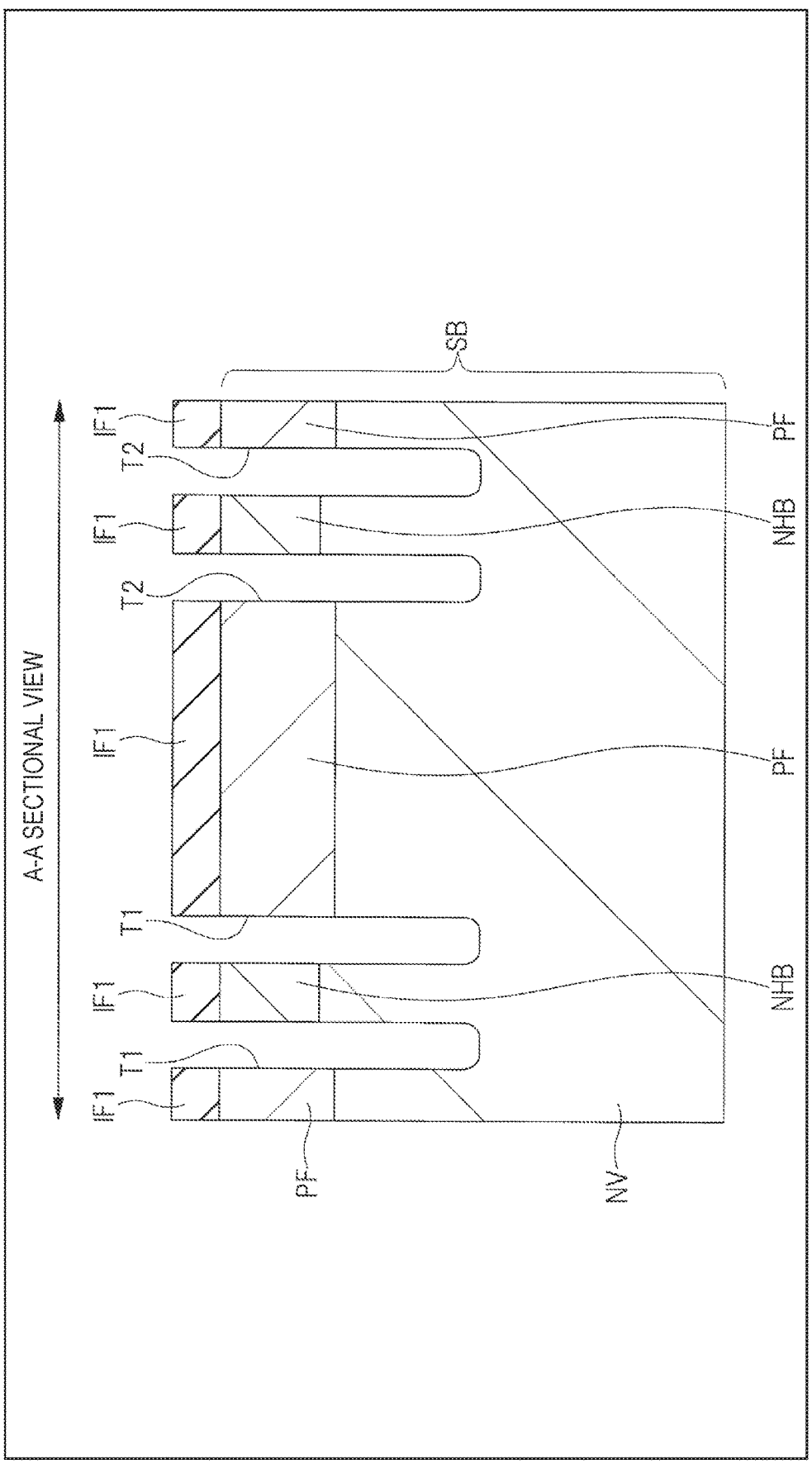
FIG. 6 is a cross-sectional view of a manufacturing process of the semiconductor device following to FIG. 5.

FIG. 6 shows a process of forming the trenches T 1 and T 2.

First, an insulating film IF1 such as a silicon oxide film is formed on the semiconductor substrate SB by, e.g., CVD (Chemical Vapor Deposition) method, and the insulating film IF1 is patterned by photolithography and dry etching. Next, using the patterned insulating film IF1 as a hard mask, the semiconductor substrate SB is etched to form a trench T 1 and a trench T 2 in the semiconductor substrate SB. Thereafter, the insulating film IF1 is removed by wet etching or the like.

Here, as shown in FIG. 2, the trenches T 1 and T 2 are formed continuously so as to extend in the Y direction in plan view.

Figure 7:
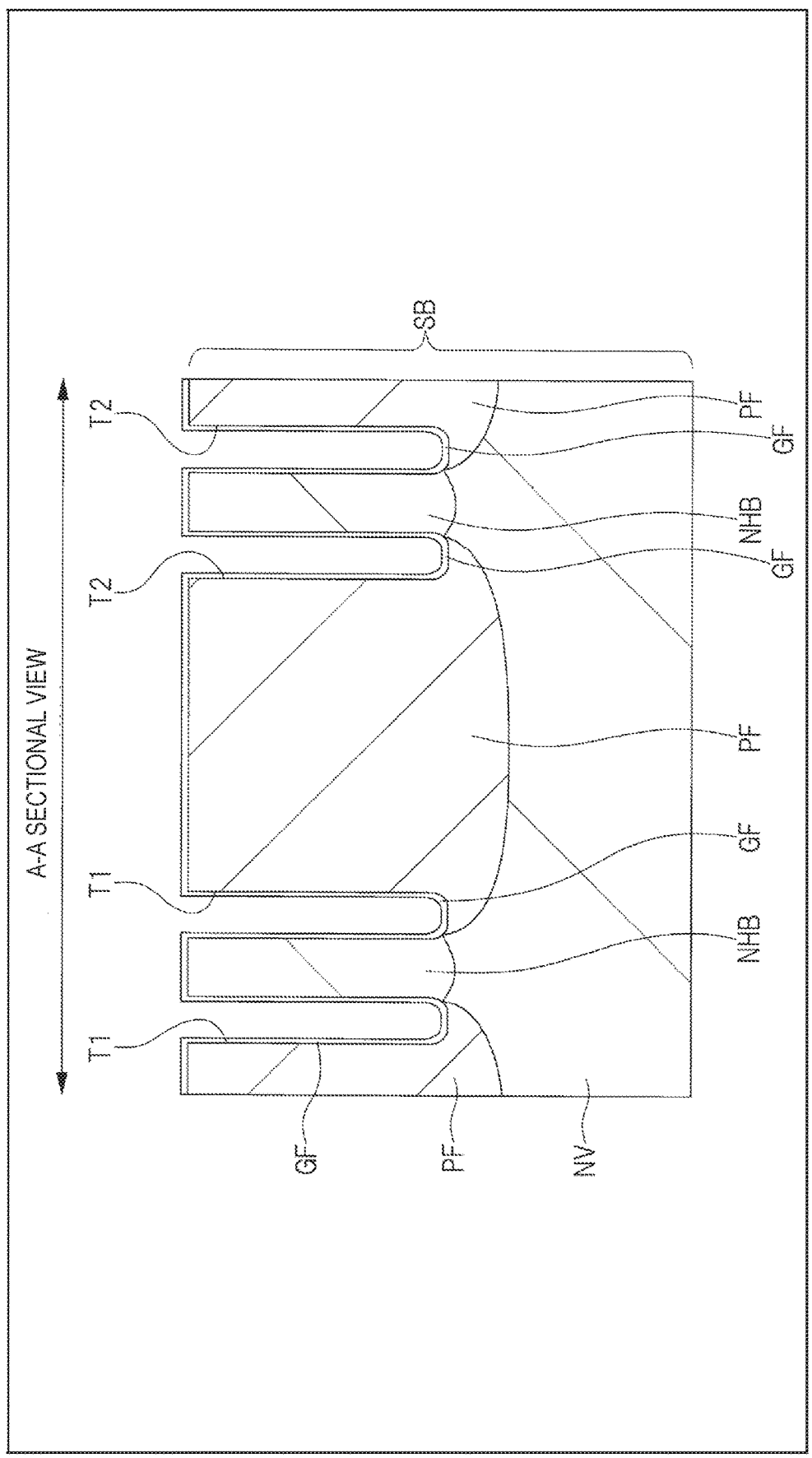
FIG. 7 is a cross-sectional view of a manufacturing process of the semiconductor device following to FIG. 6.

FIG. 7 shows a heat treatment step and a step of forming gate dielectric film GFs.

First, heat treatment is performed on the semiconductor substrate SB to diffuse the impurity contained in the hole barrier region NHB and the floating region PF. By this heat treatment, the hole barrier region NHB diffuses to a position near the bottom of each of the trenches T 1 and T 2, and the floating region PF diffuses to a position deeper than the bottom of each of the trenches T 1 and T 2 so as to cover the bottom of each of the trenches T 1 and T 2.

Note that in the case where the above-described ion implantation is performed a plurality of times, since the hole barrier region NHB and the floating region PF have already been formed to a deep position, this heat treatment step can be omitted or the time of the heat treatment step can be shortened. Next, a thermal oxidation process is performed on the semiconductor substrate SB, whereby a gate dielectric film GF made of, for example, a silicon oxide film is formed on the inner wall of the trench T 1, the inner wall of the trench T 2, the upper surface of the floating region PF, and the upper surface of the hole barrier region NHB. The thickness of the gate dielectric film GF is, for example, 100 nm.

Figure 8:
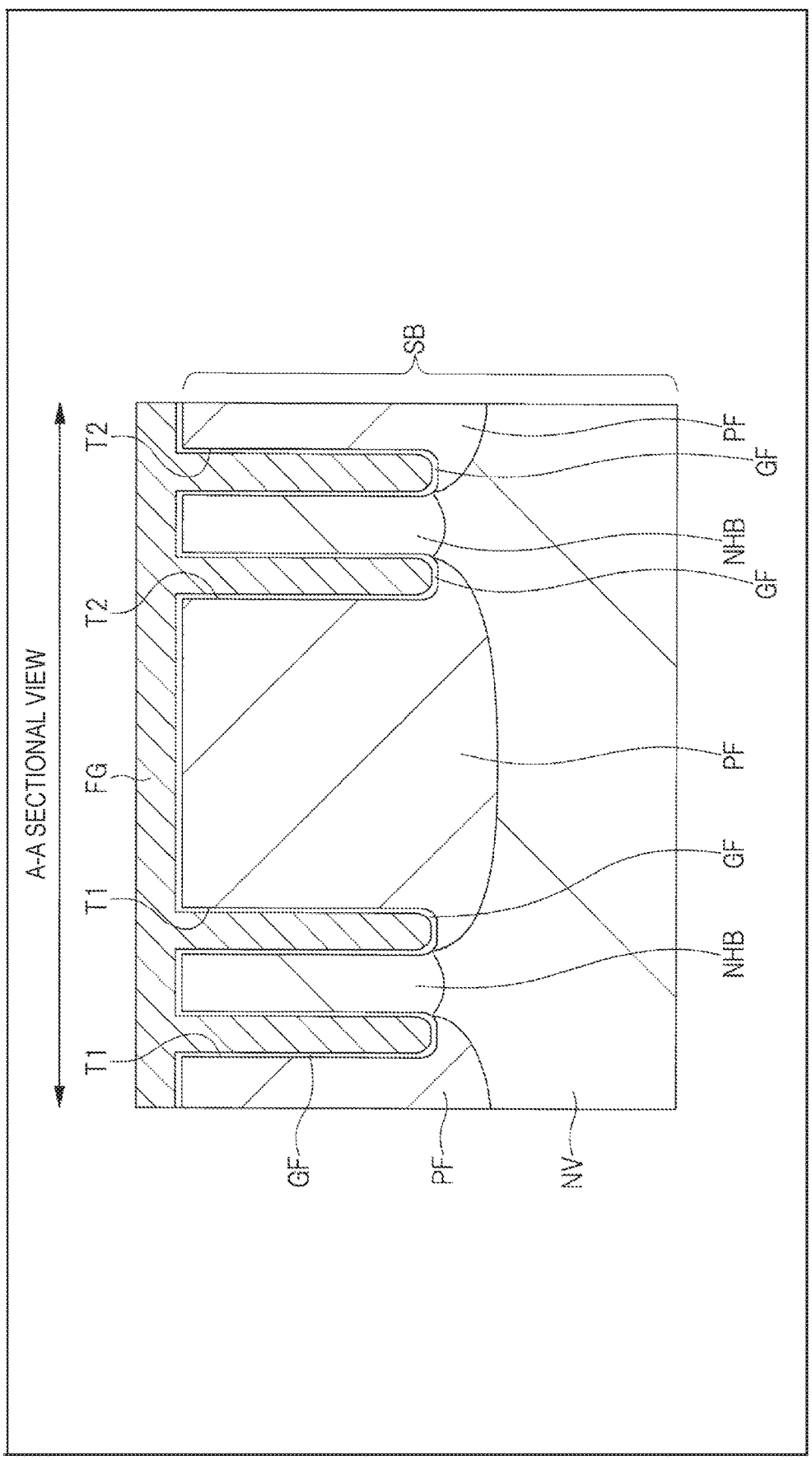
FIG. 8 is a cross-sectional view of a manufacturing process of the semiconductor device following to FIG. 7.

FIG. 8 shows a step of forming the conductive film FG.

A conductive film FG made of, for example, a polysilicon film into which an n-type impurity is introduced is formed on the gate dielectric film GF by, for example, a CVD method so as to bury the inside of the trench T 1 and the inside of the trench T 2. The thickness of the conductive film FG is, for example, 600 nm.

Figure 9:
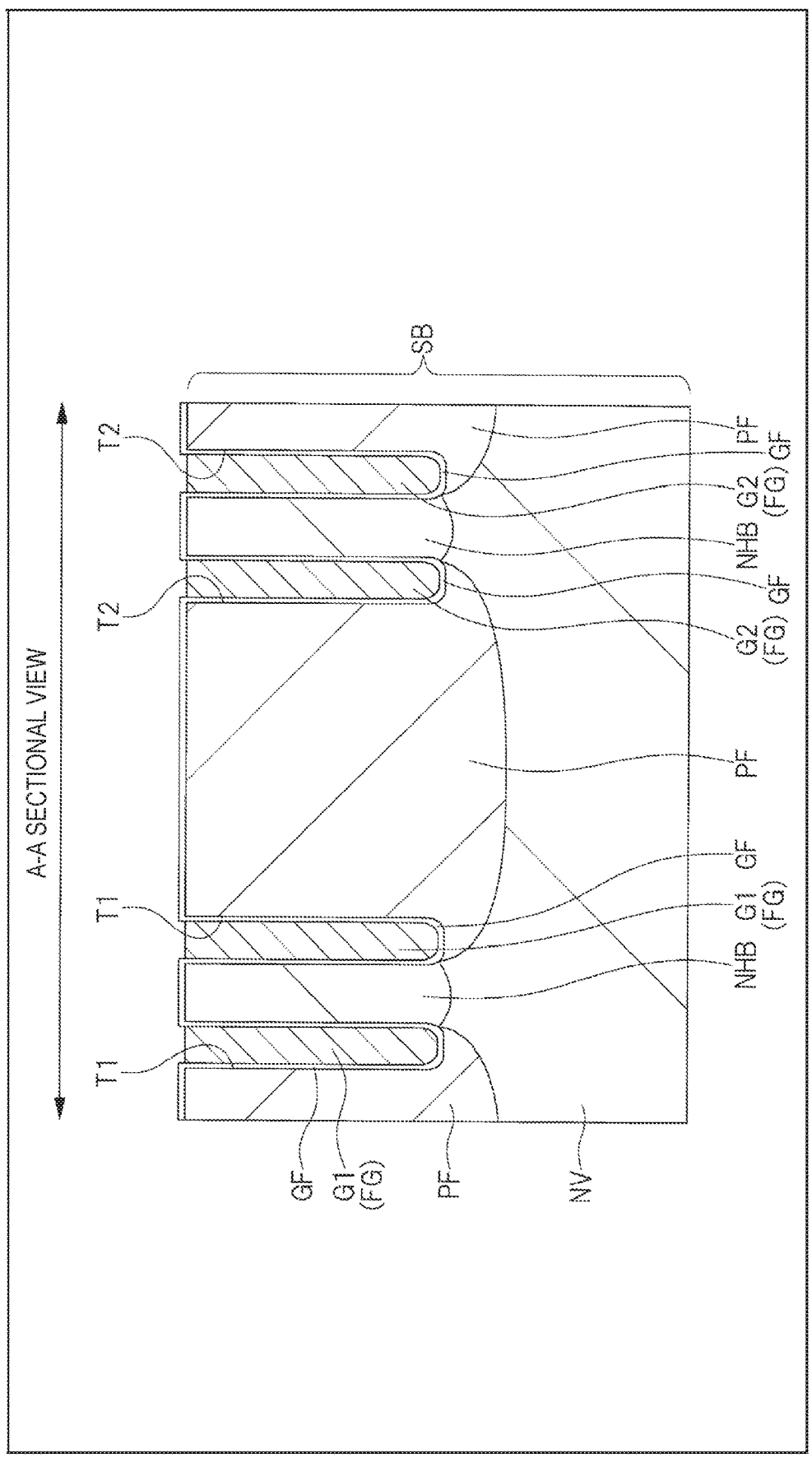
FIG. 9 is a cross-sectional view of a manufacturing process of the semiconductor device following to FIG. 8.

FIG. 9 shows a step of forming the gate electrode G 1 and the gate electrode G 2.

The conductive film FG formed outside the trench T 1 and outside the trench T 2 is removed by using a photolithography method and a dry etching process for the conductive film FG. As a result, the conductive film FG left inside the trench T 1 and inside the trench T 2 becomes the gate electrode G 1 and the gate electrode G 2.

Figure 10:
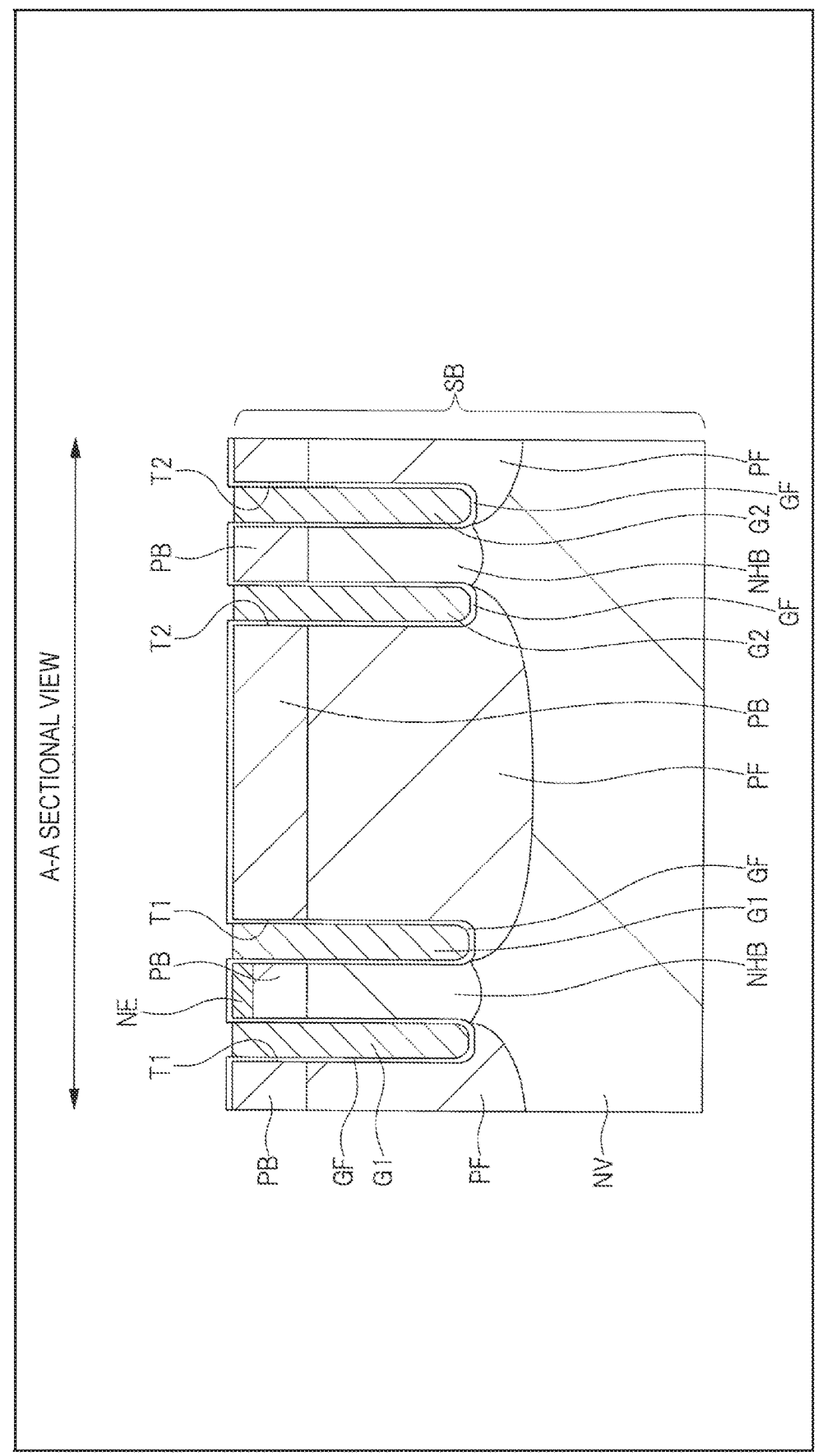
FIG. 10 is a cross-sectional view of a manufacturing process of the semiconductor device following to FIG. 9.

FIG. 10 shows a step of forming the base region PB and the emitter region NE.

First, a p-type base region PB is formed on the surface of each of the floating region PF and the hole barrier region NHB by using a photolithography method and an ion implantation method. The base region PB is an impurity region having an impurity concentration higher than that of the floating region PF. The impurity for forming the base region PB is, for example, boron (B), and the ion implantation is performed under the condition that the dose of boron (B) is about 1×10 13 per cm 2 and the energy of boron (B) is about 100 keV.

Next, an n-type emitter region NE is formed on the surface of the base region PB of the active cell region AC by photolithography and ion implantation. The emitter region NE is an impurity region having an impurity concentration higher than that of the hole barrier region NHB. At this time, the emitter region NE is not formed in the base region PB of the hole collector cell region HCC. The impurity for forming the emitter region NE is arsenic (As), for example, and the ion implantation is performed under the condition that the dose of arsenic (As) is about 5×10 15 per cm 2 and the energy of arsenic (As) is about 80 keV.

Figure 11:
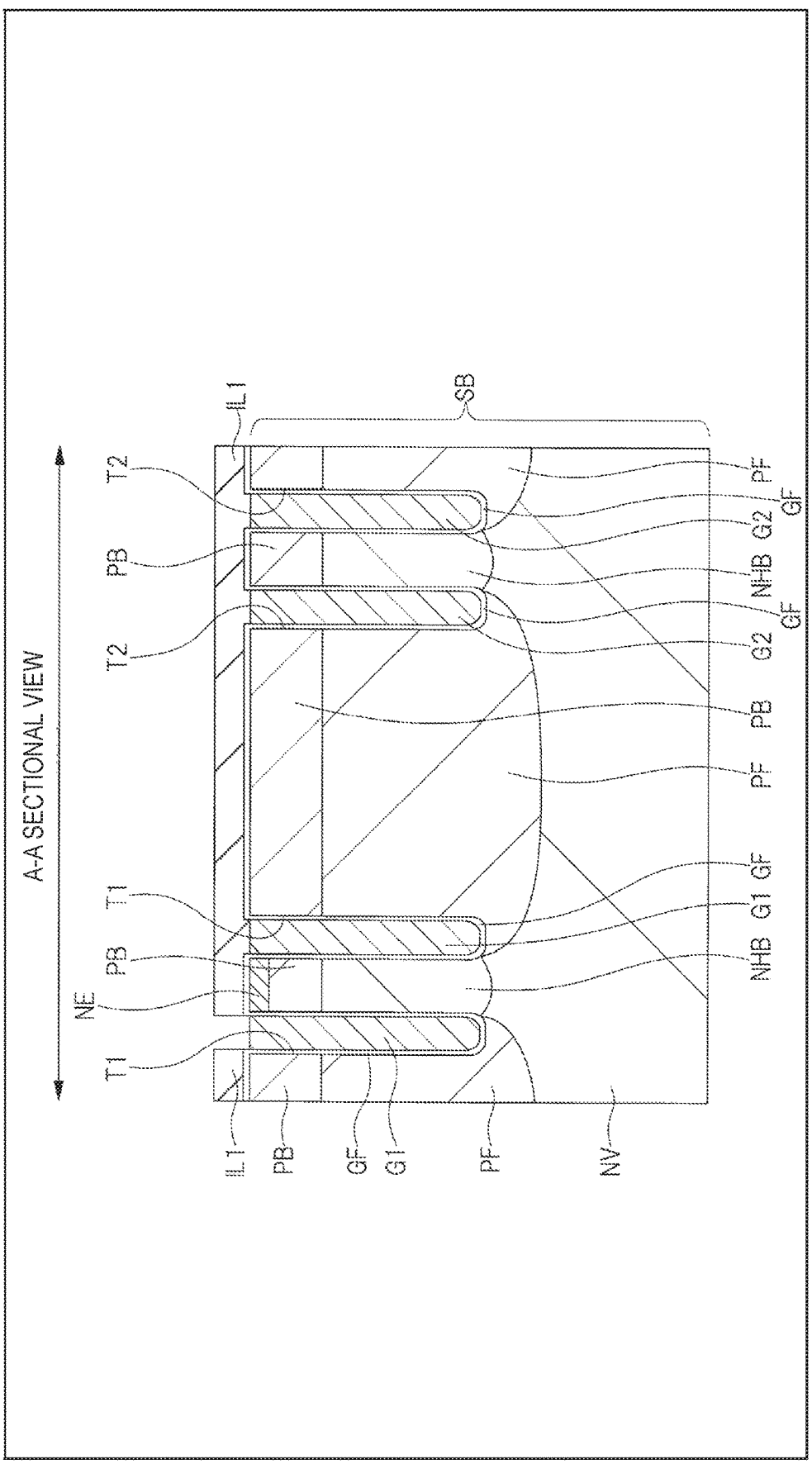
FIG. 11 is a cross-sectional view of a manufacturing process of the semiconductor device following to FIG. 10.

FIG. 11 shows a step of forming the interlayer insulating film IL1.

First, an interlayer insulating film IL1 such as a silicon oxide film is formed on the upper surface of each of the gate dielectric film GF, the gate electrode G 1, and the gate electrode G 2 by, e.g., CVD. Next, opening patterns are formed in the interlayer insulating film IL1 by photolithography and dry etching. The opening pattern selectively opens one of the two gate electrodes G 1.

Figure 12:
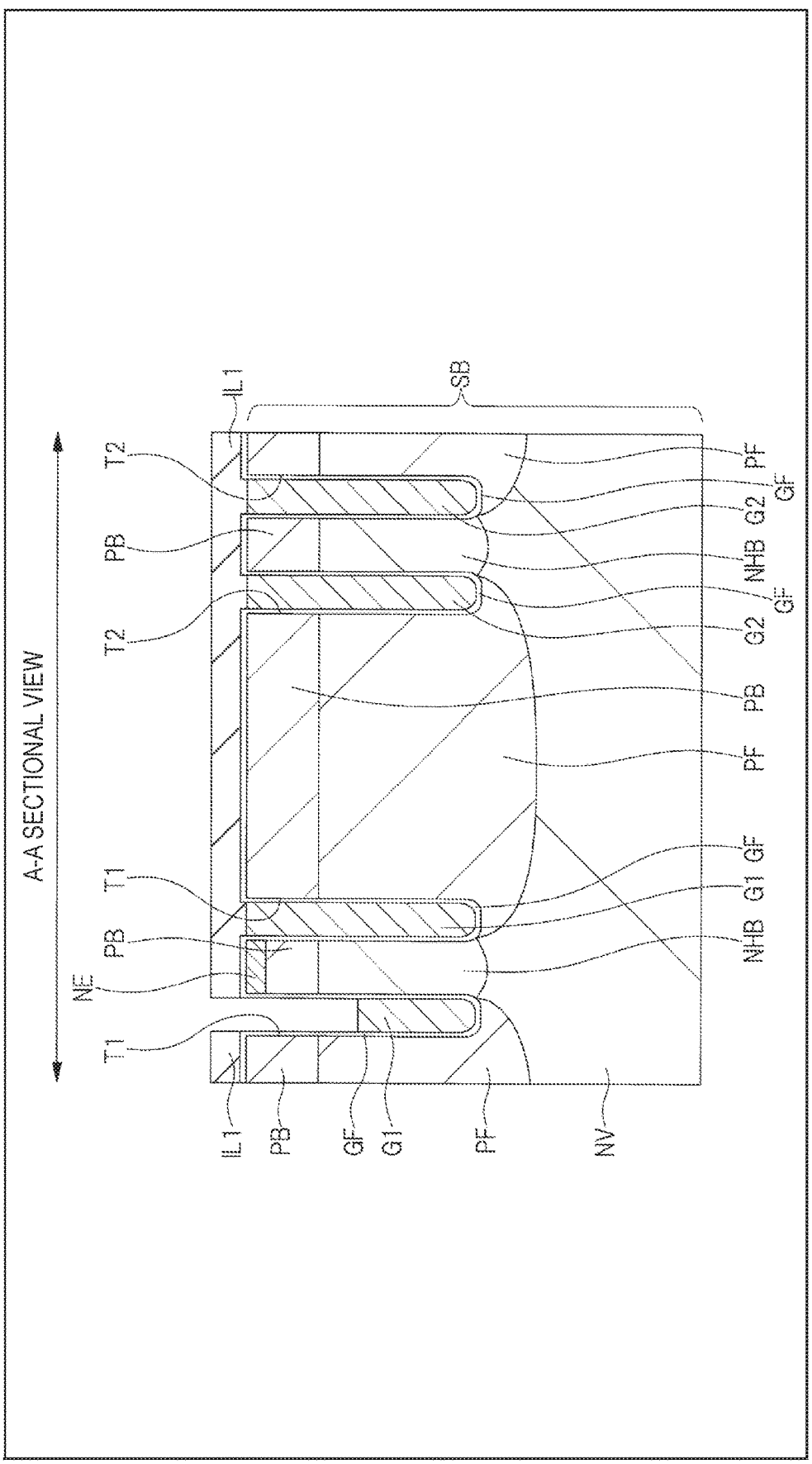
FIG. 12 is a cross-sectional view of a manufacturing process of the semiconductor device following to FIG. 11.

FIG. 12 shows the step of receding the gate electrode G 1.

By performing an etch process using the interlayer insulating film IL1 as a mask, one of the gate electrodes G 1 exposed from the interlayer insulating film IL1 is recessed. This etching process may be either an anisotropic etching process or an isotropic etching process. The receding amount of the gate electrode G 1 can be appropriately set by adjusting the time of the etching process. Here, the case where the gate electrode G 1 in the upper portion of the trench T 1 is removed and the gate electrode G 1 remains in the lower portion of the trench T 1 is exemplified, and the case where the position of the upper surface of the gate electrode G 1 is lower than the base region PB and the interlayer insulating film IL2 described later is formed to a position deeper than the base region PB is exemplified.

Figure 13:
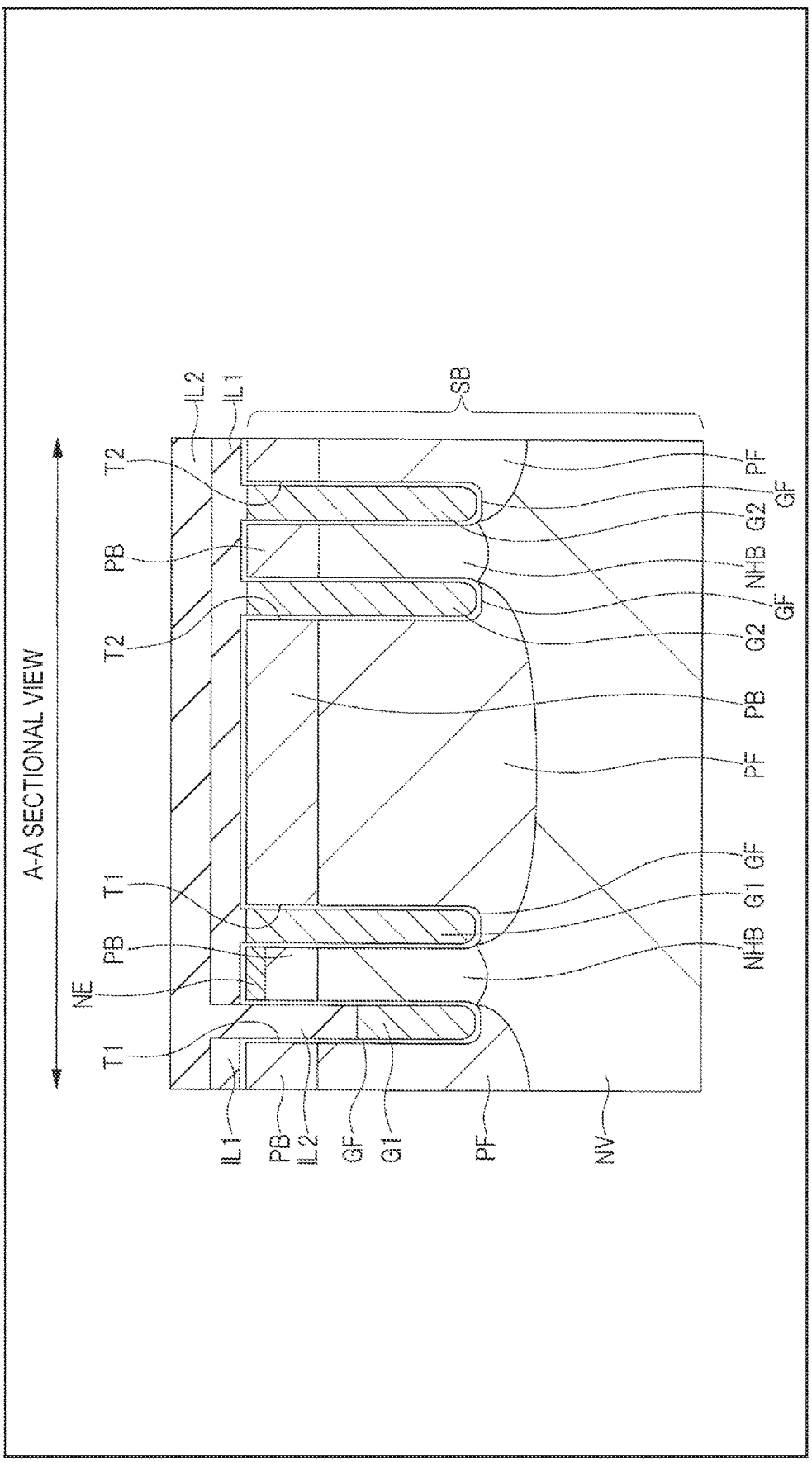
FIG. 13 is a cross-sectional view of a manufacturing process of the semiconductor device following to FIG. 12.

FIG. 13 shows a step of forming the interlayer insulating film IL2.

First, an interlayer insulating film IL2 such as, for example, a silicon oxide film is formed on the interlayer insulating film IL1 by, for example, a CVD method so as to bury the inside of the trench T 1 in which the gate electrode G 1 has receded. Thereafter, the upper surface of the interlayer insulating film IL2 may be planarized by a Chemical Mechanical Polishing method or the like as required.

Figure 14:
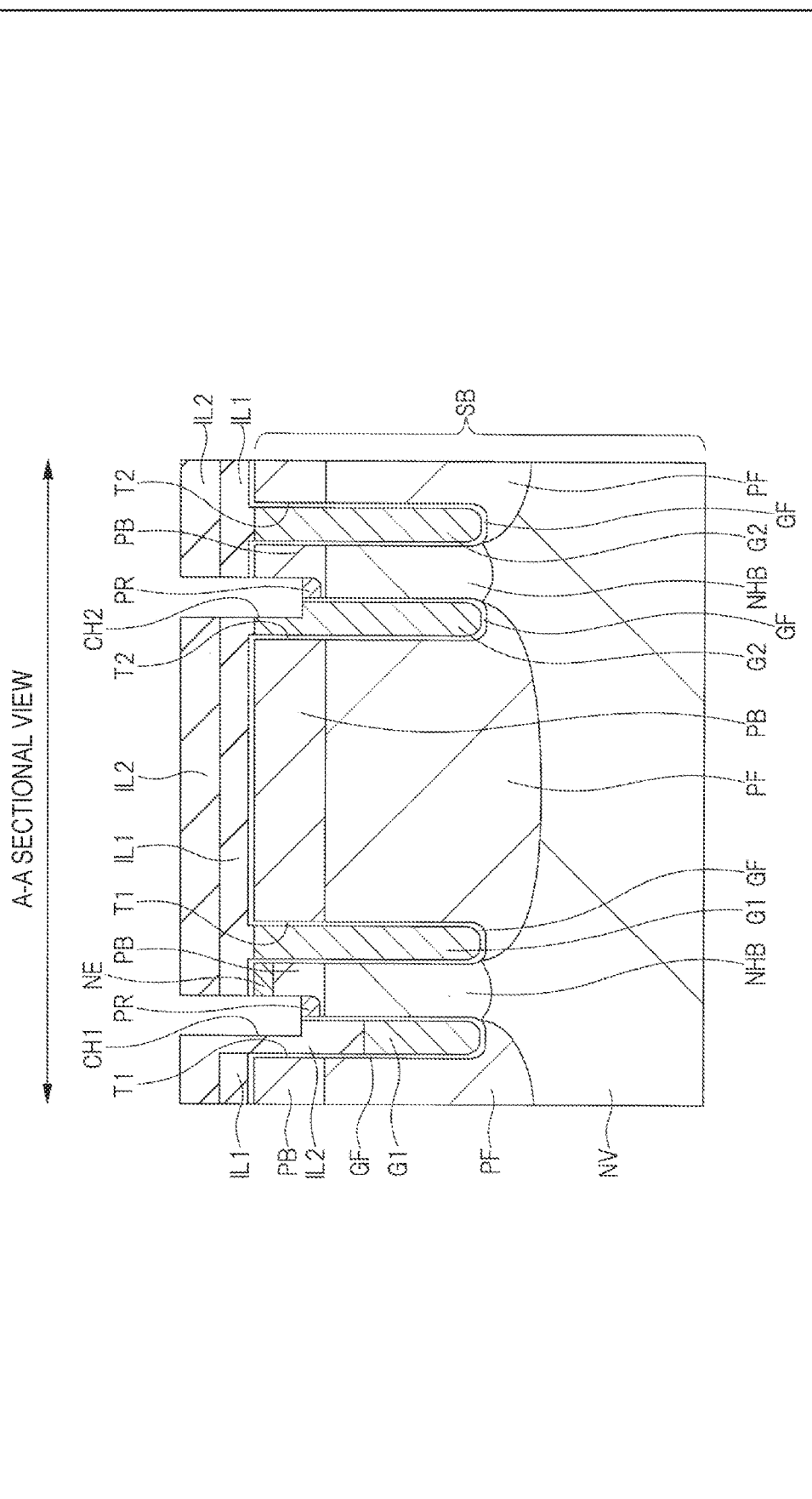
FIG. 14 is a cross-sectional view of a manufacturing process of the semiconductor device following to FIG. 13.

FIG. 14 shows steps of forming the contact hole CH1, the contact hole CH2, and the body regions PR.

By using a photolithography method and a dry-etching process, a contact hole CH1 is formed in the active cell region AC that penetrates the interlayer insulating film IL2, the interlayer insulating film IL1, the gate dielectric film GF, and the emitter region NE and reaches the base region PB. In the hole collector cell region HCC, a contact hole CH2 penetrating the interlayer insulating film IL2, the interlayer insulating film IL1, and the gate dielectric film GF and reaching the base region PB is formed.

As described above, in plan view, the contact hole CH1 is formed at a position overlapping with one of the two trenches T 1, and the bottom portion of the contact hole CH1 is located on the interlayer insulating film IL2 in the trench T 1 and in the base area PB without contacting the gate electrode G 1. In plan view, the contact hole CH2 is formed at a position overlapping with one of the two trenches T 2, and the bottom of the contact hole CH2 is located on the gate electrode G 2 in the trench T 2 and in the base region PB.

Next, a p-type body region PR is formed in the base region PB under each of the contact hole CH1 and the contact hole CH2 by using a photolithography method and an ion implantation method. The body region PR is an impurity region having an impurity concentration higher than that of the base region PB. The body region PR of the active cell region AC is formed so as not to contact the n-type emitter region NE. The impurity for forming the body regions PR is, for example, boron difluoride (BF2), and the ion implantation is performed under the condition that the dose is about 5×10 15 per cm (2) and the energy is about 80 keV. Thereafter, heat treatment for activating each impurity region is performed.

Figure 15:
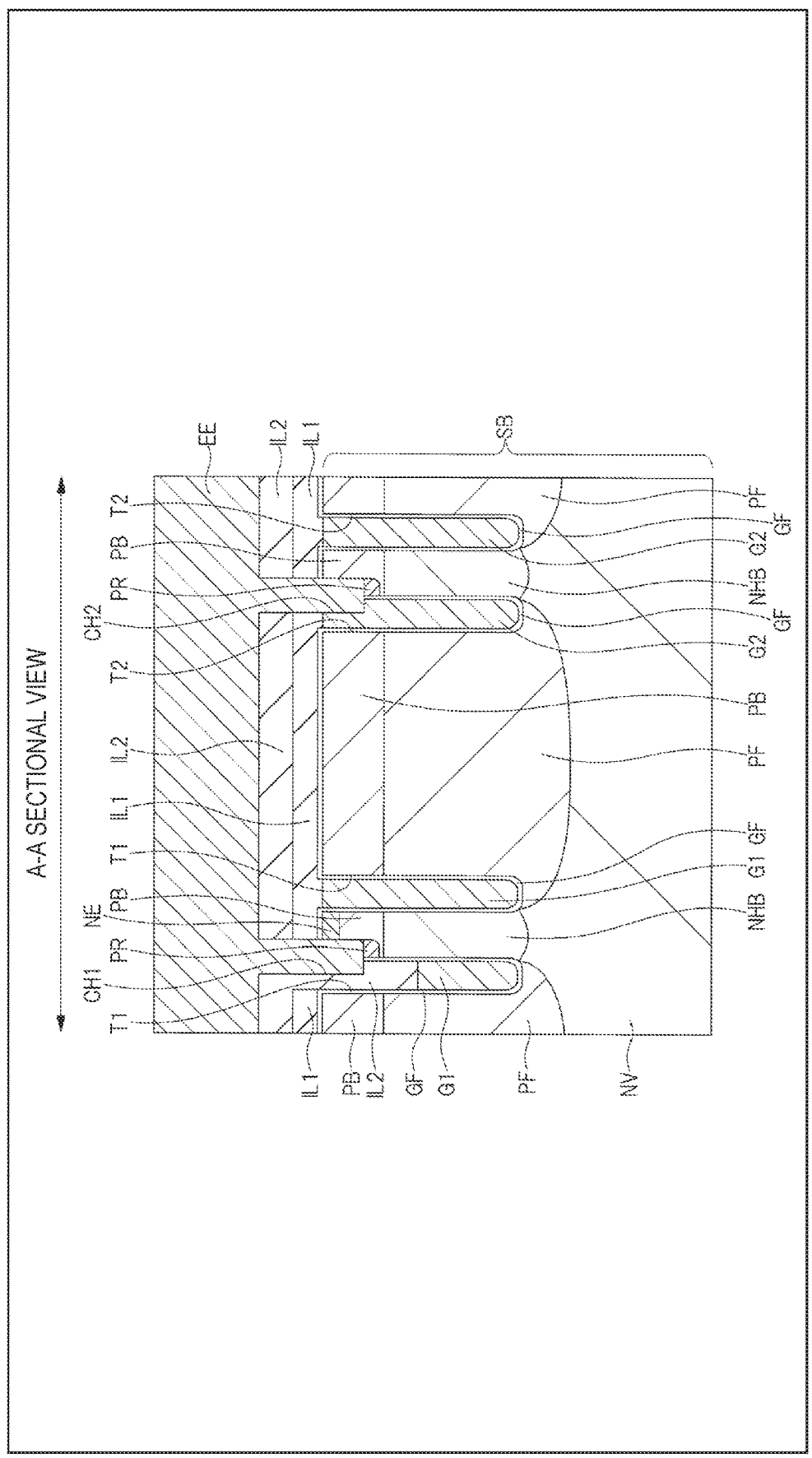
FIG. 15 is a cross-sectional view of a manufacturing process of the semiconductor device following to FIG. 14.

FIG. 15 shows a step of forming the emitter potential electrode EE.

First, an aluminum film, for example, is formed on the interlayer insulating film IL2 by, for example, a sputtering method so as to fill the contact hole CH1 and the contact hole CH2. Thereafter, the aluminum film is patterned by photolithography and dry etching to form an emitter potential electrode EE. At this time, the gate potential electrode GE and the guard ring GR shown in FIG. 1 are also formed by patterning the aluminum film.

Before the formation of the aluminum film, a barrier metal film made of, for example, a titanium nitride film may be formed, and the aluminum film may be formed on the barrier metal film. That is, the emitter potential electrode EE or the like may be a laminated film of a barrier metal film and an aluminum film.

Thereafter, the field stop region NS, the collector region PC, and the collector potential electrode CE are formed on the back surface of the semiconductor substrate SB, whereby the structure shown in FIG. 3 is obtained.

First, as required, the back surface of the semiconductor substrate SB is polished to reduce the thickness of the semiconductor substrate SB. Next, ion implantation is performed from the back surface of the semiconductor substrate SB. By this ion implantation, an n-type field stop region NS and a p-type collector region PC are formed. The field stop region NS is an impurity region having an impurity concentration higher than that of the drift region NV. The impurity for forming the field stop regions NS is, for example, phosphorus (P), and the ion implantation is performed under the condition that the dose is about 7×10 12 per cm 2 and the energy is about 350 keV. The impurity for forming the collector region PC is, for example, boron (B), and the ion implantation is performed under the condition that the dose of boron (B) is about 1×10 13 per cm 2 and the energy of boron (B) is about 40 keV.

Next, collector potential electrodes CE made of a metallic film such as a titanium nitride film are formed on the surfaces of the collector regions PC exposed on the back surfaces of the semiconductor substrate SBs by, for example, a sputtering method or a CVD method.

As described above, the semiconductor device of the present embodiment is manufactured.

Figure 16:
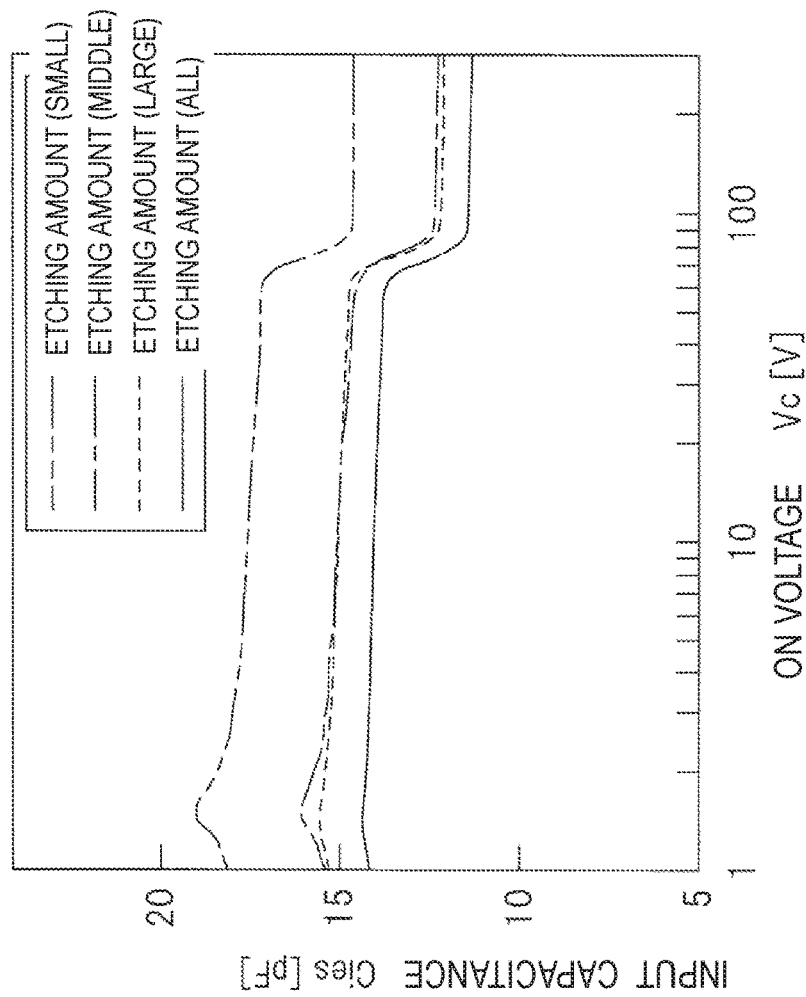
FIG. 16 is a graph showing the results of experimentation by the present inventor.
Figure 17:
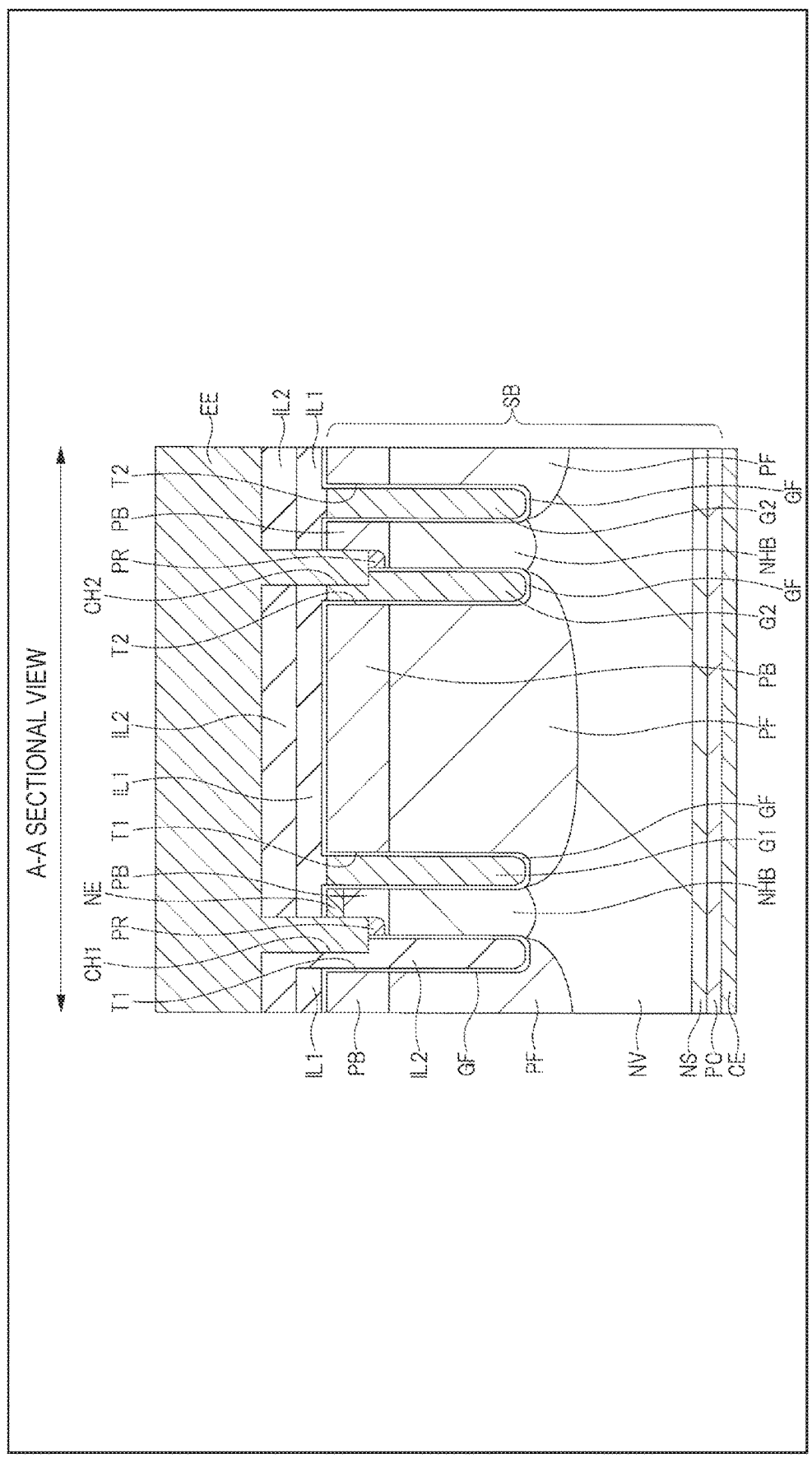
FIG. 17 is a cross-sectional view of a semiconductor device of a first modified embodiment according to the first embodiment.

The semiconductor device of the first modified example of first embodiment will be described below with reference to FIGS. 16 and 17. FIG. 16 is a graph showing the results of experiments conducted by the inventors of the present application, and FIG. 17 is a cross-sectional view of the semiconductor device of first modified example. In the following explanation, differences from first embodiment will be mainly explained.

In the first embodiment, the interlayer insulating film IL2 in the trench T 1 is formed to a position deeper than the base region PB, and the gate electrode G 1 is left under the trench T 1.

FIG. 16 illustrates the relation between the on-voltage Vc and the input capacitance Cies, which varies with the amount of etch that retracts the gate electrode G1. In FIG. 16, the two-dot chain line indicates that the gate electrode G 1 in the trench T 1 is etched to such an extent that the upper surface of the gate electrode G 1 becomes shallower than the base region PB. The dashed-dotted line, the dashed line, and the solid line indicate that the gate electrode G 1 in the trench T 1 is etched to such an extent that the upper surface of the gate electrode G 1 is deeper than the base region PB, and the amount of etching increases in the order of the dashed-dotted line, the dashed line, and the solid line. The solid line indicates the case where all of the gate electrodes G 1 in the trenches T 1 are removed. As can be seen from the graphs of FIG. 16, as the amount of etching of the gate electrode G 1 increases, it is possible to suppress an increase in the input capacitance Cies, which is the most effective when the gate electrode G 1 in the trench T 1 is entirely removed. Therefore, in the case of the solid line, the deterioration of the switching characteristics of the IGBT can be most suppressed.

FIG. 17 shows an cross-sectional view of the solid line semiconductor device of FIG. 16 in first modified example. The interlayer insulating film IL2 is buried in the trench T 1 from which all the gate electrodes G 1 have been removed. Accordingly, in the plan view of FIG. 2, since there is no gate electrode G1 below the inter-layer insulating film IL2, the gate electrode G1 on the top (first position) of the sheet surface and the gate electrode G1 on the bottom (second position) of the sheet surface are individually connected to the gate potential electrode GE at the ends of the active cell region AC.

As described above, in the configuration of FIG. 17 (solid line in FIG. 16), although the increase of the input capacitance Cies is most suppressed, according to the study by the inventor of the present application, it is effective not to remove all of the gate electrodes G 1 in the trenches T 1 from the viewpoint of lowering the on-voltage Vc. For example, in the structure of FIG. 17, the on-voltage Vc decreased by 0.04 V, whereas in the structure of FIG. 3, indicated by the dashed line in FIG. 16, the on-voltage Vc decreased by 0.11 V. As described above, since there is a trade-off relationship between the reduction of the on-state voltage Vc and the improvement of the switching characteristics, it is desirable to variously change the on-state voltage Vc in accordance with the desired device characteristics.

The semiconductor device of the second modified example of the first embodiment will be described below (second modified example). In the following explanation, differences from first embodiment will be mainly explained.

The semiconductor device of first embodiment is particularly useful for a IGBT that performs a switching operation at a high speed. For this purpose, it is preferable that the impurity concentration of the p-type collector region PC formed on the back surface of the semiconductor substrate SB is as thin as possible. The impurity for forming the collector region PC is boron, for example, and the ion implantation is performed under the condition that the dose is about 1×10 12 per cm 2 to 2×10 13 per cm 2 and the energy is about 10 keV to 100 keV. However, when the impurity concentration of the collector region PC is low, the kirk effect strongly contributes when the IGBT is turned off, and dielectric breakdown tends to occur in the collector region PC.

In order to solve such a problem, it is effective to use ion implantation a plurality of times as a means for forming the field stop region NS. The impurity for forming the field stop regions NS is phosphorus or protons, and the ion implantation is performed under the condition that the dose is about 5×10 12 per cm 2 to 1×10 14 per cm 2. The depth of the field stop area NS from the back surface of the semiconductor substrate SB is 30 µm or less, for example, 5 to 20 µm.

By using such a device, it is possible to suppress surging voltages when the IGBT is turned off and to prevent dielectric breakdown.

Figure 18:
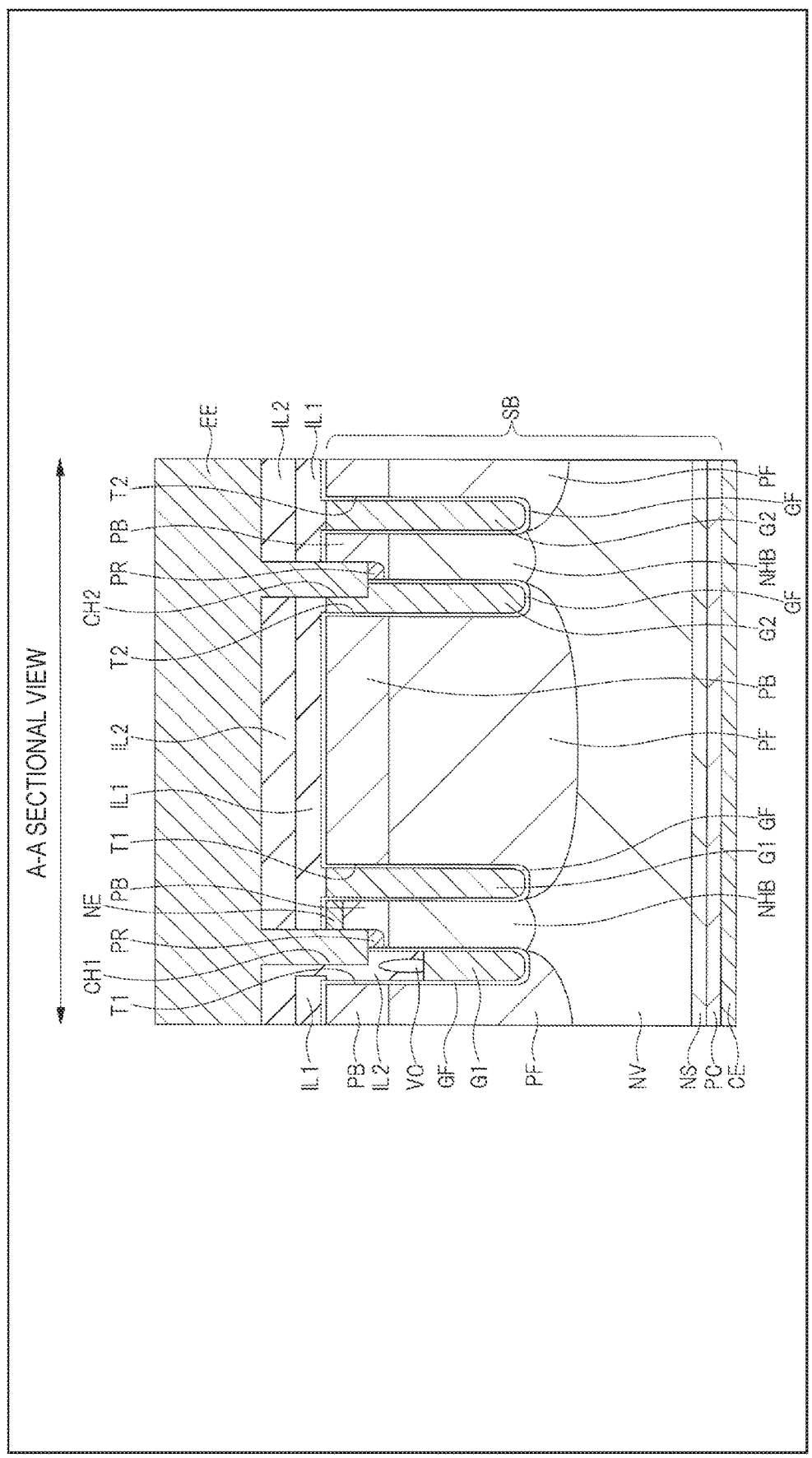
FIG. 18 is cross-sectional view of a semiconductor device according to a second embodiment.

The semiconductor device of second embodiment will be described below with reference to FIG. 18. FIG. 18 is a cross-sectional view of the semiconductor device of second embodiment. In the following explanation, differences from first embodiment will be mainly explained.

In first embodiment, the interlayer insulating film IL2 was completely buried in the trench T 1 in which the gate electrode G 1 was recessed. In second embodiment, as shown in FIG. 18, a cavity VO is formed in a portion of the interlayer insulating film IL2 within trench T1.

For example, when the semiconductor chip CHP is heated, stresses are generated in the trench T 1, and defects or dislocations may occur in the semiconductor substrate SBs around the trench T 1. However, by forming such a cavity VO, the stress can be relieved, so that the above-mentioned defect or dislocation can be prevented.

A contact hole CH1 is formed on the interlayer insulating film IL2 in the trench T 1, and emitter potential electrodes EE are formed in the contact hole CH1. Here, when the contact hole CH1 reaches the cavity VO, the emitter potential electrode EE is also formed in the cavity VO, and there is a possibility that the emitter potential electrode EE and the gate electrode G 1 are short-circuited. Accordingly, the contact hole CH1 must be formed so that it does not reach the cavity VO.

Figure 19:
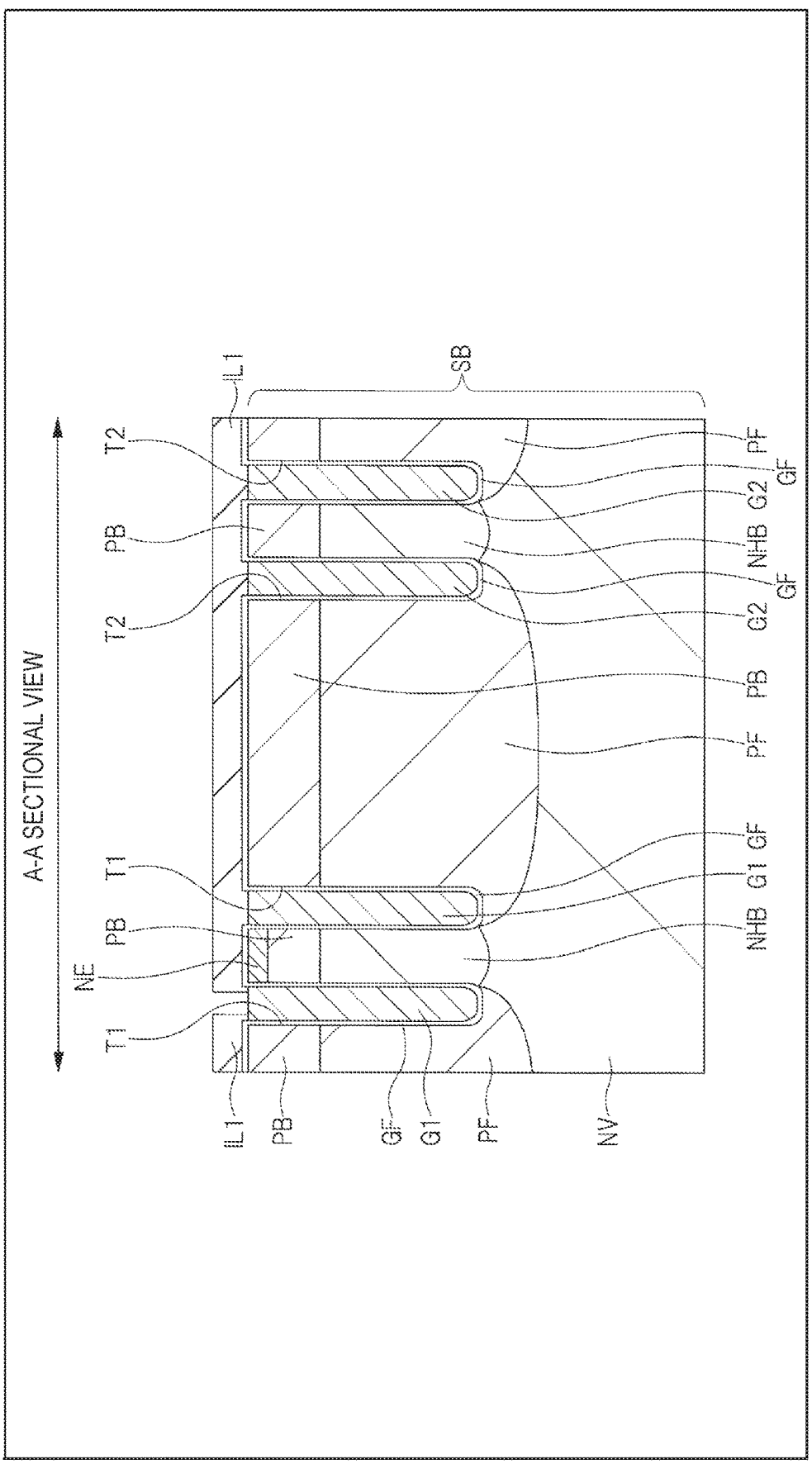
FIG. 19 is a cross-sectional view of a manufacturing process of the semiconductor device according to the second embodiment.
Figure 20:
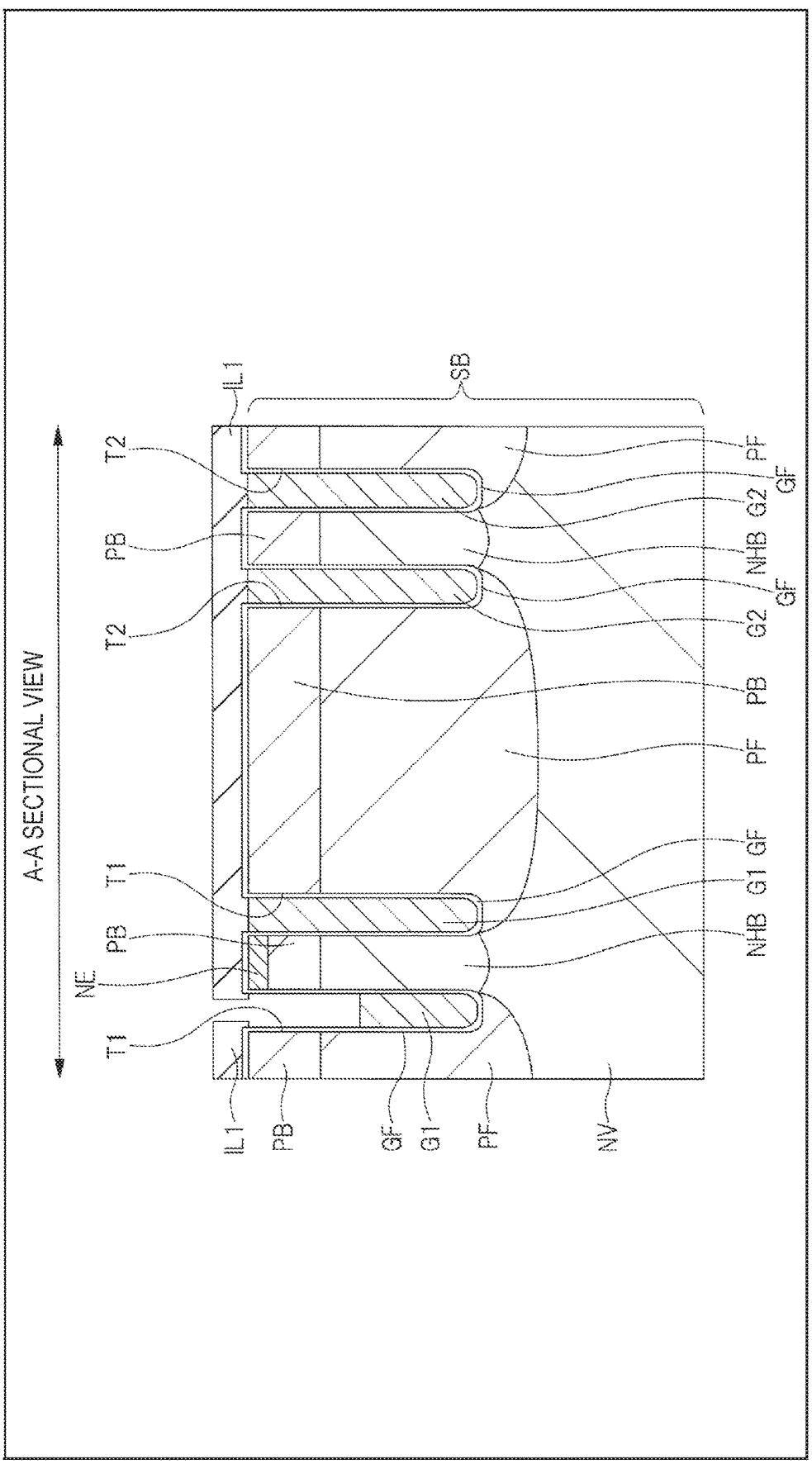
FIG. 20 is a cross-sectional view of a manufacturing process of the semiconductor device following to FIG. 19.
Figure 21:
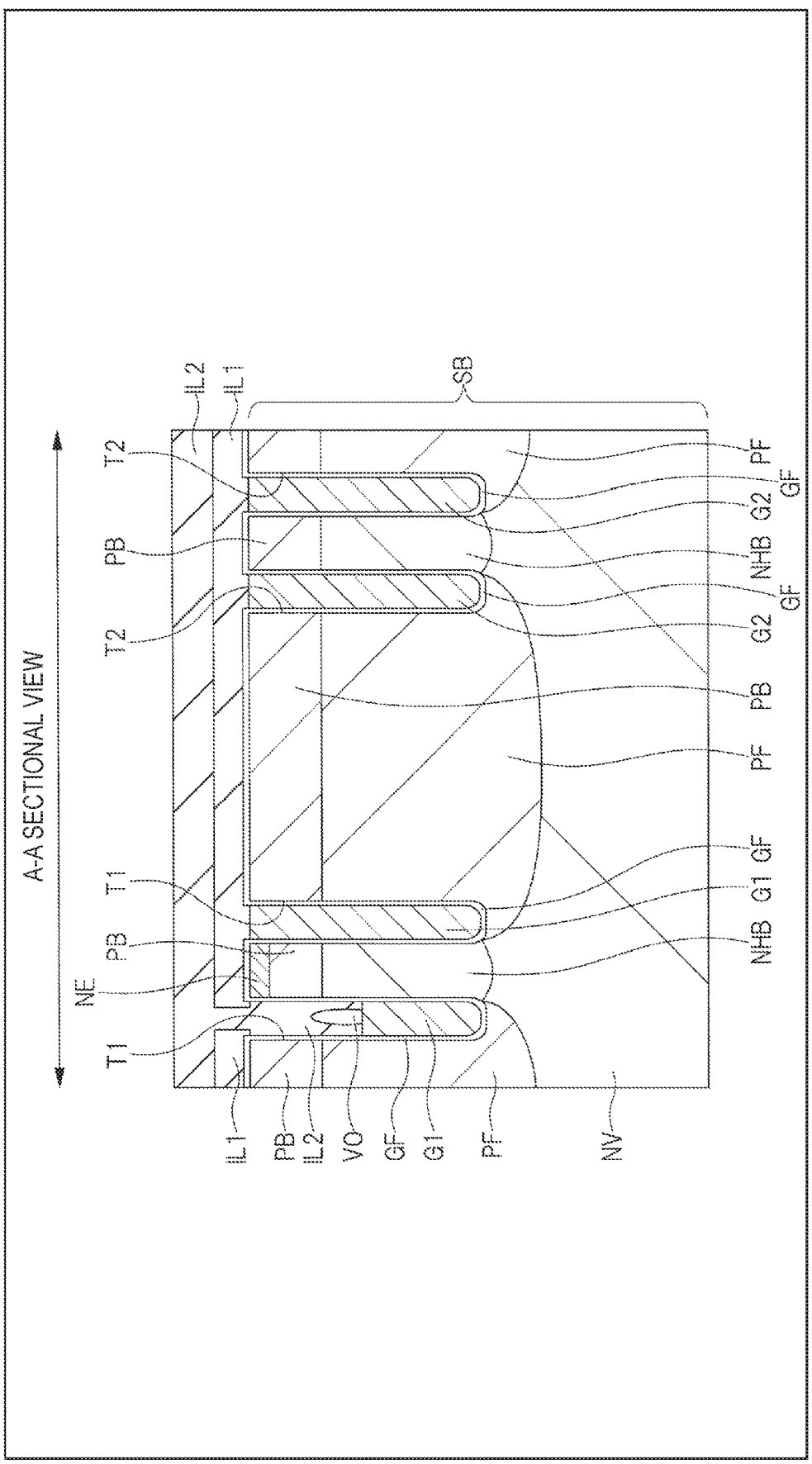
FIG. 21 is a cross-sectional view of a manufacturing process of the semiconductor device following to FIG. 20.

FIGS. 19 to 21 show the manufacturing method of the semiconductor device of second embodiment.

FIG. 19 shows the manufacturing process subsequent to FIG. 10. As shown in FIG. 19, in the second embodiment, the opening patterns of the interlayer insulating film IL1 are located on the upper surface of the gate electrode G 1 buried in the trench T 1. Here, the width of the opening pattern is set to be smaller than the width of the trench T 1.

Next, as shown in FIG. 20, the gate electrode G 1 in the trench T 1 is retreated by performing an etch process with the opening patterns formed in the interlayer insulating film IL1. Here, since the interlayer insulating film IL1 on the trench T 1 has an eaves shape, it is preferable that this receding step is performed by an isotropic etch process in order to remove the gate electrode G 1 existing under the eaves.

Next, as shown in FIG. 21, an interlayer insulating film IL2 is formed so as to fill the trench T 1 in which the gate electrode G 1 is recessed. Here, as described above, since the opening patterns of the interlayer insulating film IL1 are narrow and the interlayer insulating film IL1 has an eaves shape, the aspect ratio is high. Accordingly, the interlayer insulating film IL2 is not completely implanted in the trench T1 and can form a cavity VO in the interlayer insulating film IL2.

The subsequent manufacturing process is the same as the first embodiment manufacturing process from FIG. 14 onward, and the structures shown in FIG. 18 can be obtained as described above.

Figure 22:
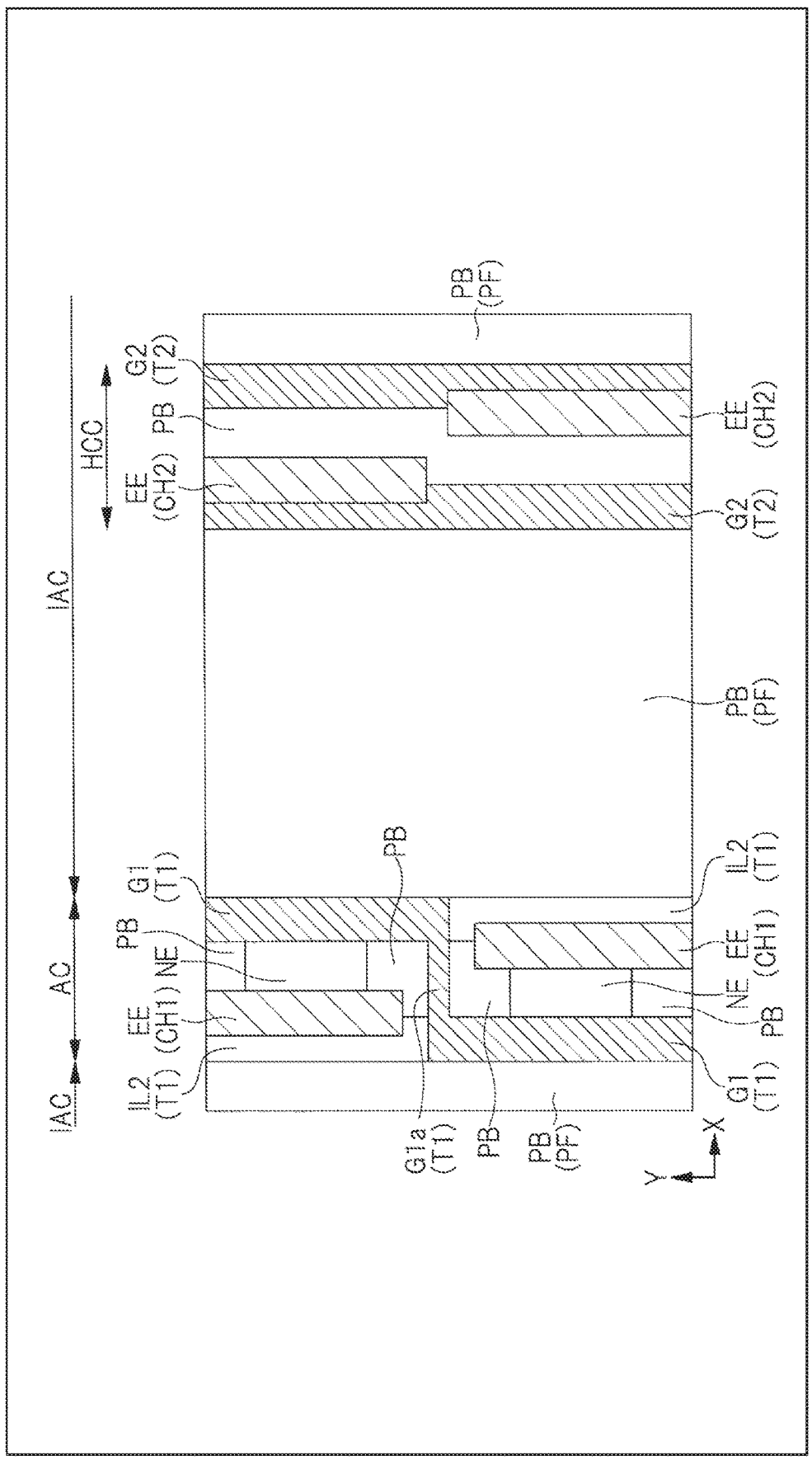
FIG. 22 is a plan view of a main part of a semiconductor device according to a third embodiment.

The semiconductor device of third embodiment will be described below with reference to FIG. 22. FIG. 22 is a main portion plan view of the semiconductor device of third embodiment. In the following explanation, differences from first embodiment will be mainly explained.

In the third embodiment, two gate electrodes G 1 of the active cell area AC are connected by a gate connecting portion G 1 a. Like the gate electrode G 1, the gate connection portion G 1 a is formed to be buried in the trench T 1. Therefore, the gate connection portion G 1 a is integrated with the gate electrode G 1.

The main characteristic of the present application is that the gate electrode G 1 in the trench T 1 is retracted, and the interlayer insulating film IL2 is formed on the retracted gate electrode G 1; however, if the amount of etching for retracting the gate electrode G 1 is large, the resistance of the gate electrode G 1 rises. Here, as shown in FIG. 22, by connecting a trench T 1 in which two gate electrodes G 1 having increased resistance are formed and providing a gate connection portion G 1 a at this connection portion, it is possible to suppress an increase in resistance of the entire gate electrode G 1 in the active cell region AC.

In addition, it is most effective to apply the gate connecting portion G 1 a of third embodiment to the structure in which all the gate electrodes G 1 in the trench T 1 are removed as shown in FIG. 17 of the above-mentioned first modified example. By forming a plurality of such gate connection portions G 1 a in the active cell region AC, the structure shown in FIG. 22 can be formed by turning back a plurality of times.

It should be noted that the third embodiment technique can also be applied to the semiconductor device of second embodiment described above.

Figure 23:
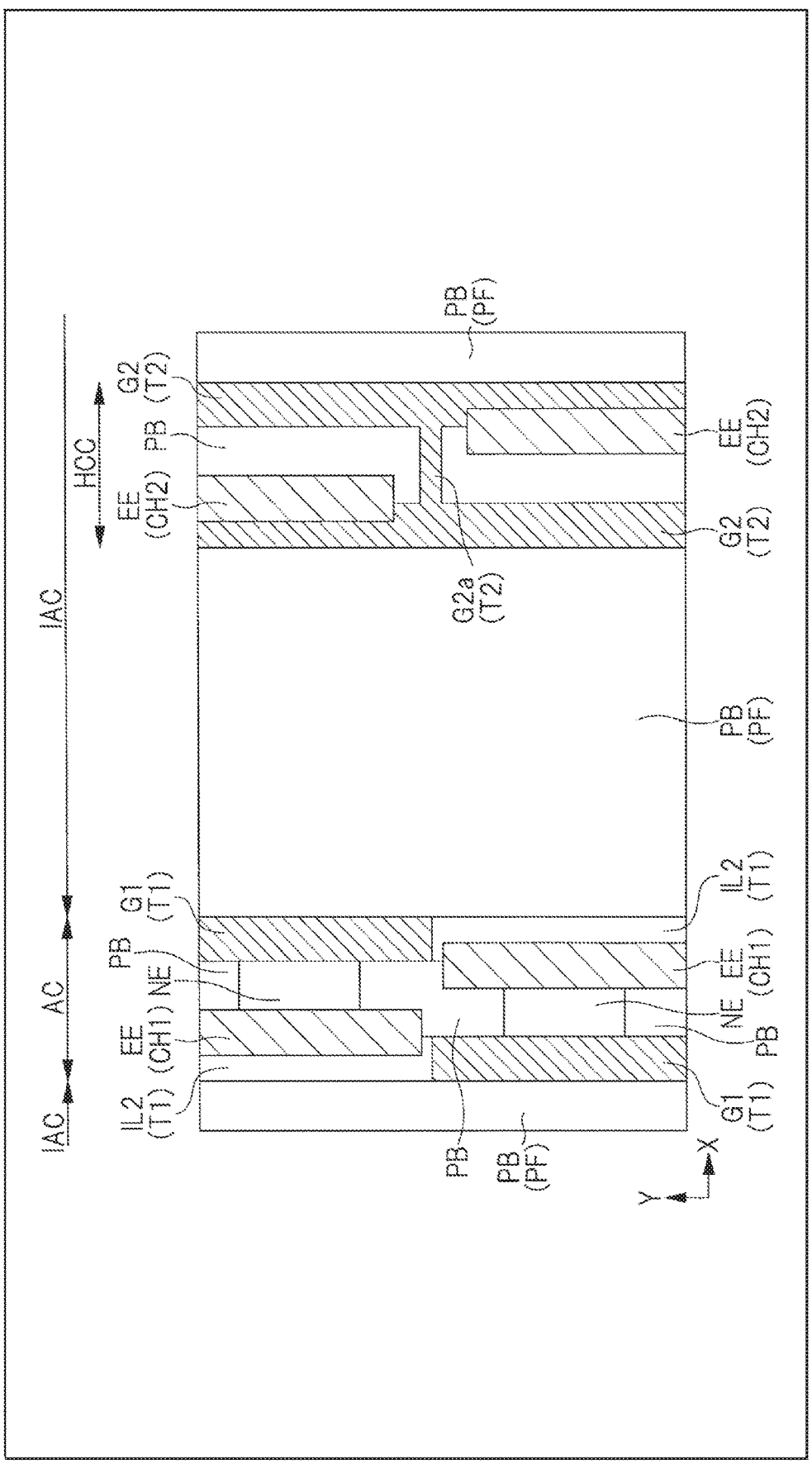
FIG. 23 is a plan view of a main part of a semiconductor device according to a fourth embodiment.

The semiconductor device of fourth embodiment will be described below with reference to FIG. 23. FIG. 23 is a main portion plan view of the semiconductor device of fourth embodiment. In the following explanation, differences from first embodiment will be mainly explained.

In the fourth embodiment, two gate electrodes G 2 of the hole collector cell regions HCCs are connected by a gate connecting portion G 2 a. Like the gate electrode G 2, the gate connection portion G 2 a is formed to be buried in the trench T 2. Therefore, the gate connection portion G 2 a is integrated with the gate electrode G 2.

As described above, the hole collector cell regions HCCs are mainly provided for discharging holes by the parasitic p-type MOSFET operation. However, if the holes are excessively discharged, the IE effect is weakened and the switching loss at the time of turn-on is increased. Therefore, by connecting the two gate electrodes G 2 by the gate connecting portion G 2 a, the parasitic p-type MOSFET operation can be suppressed, and the IE-effect can be improved.

It should be noted that the fourth embodiment technique can also be applied to the second embodiment and 3 semiconductor device described above.

Figure 24:
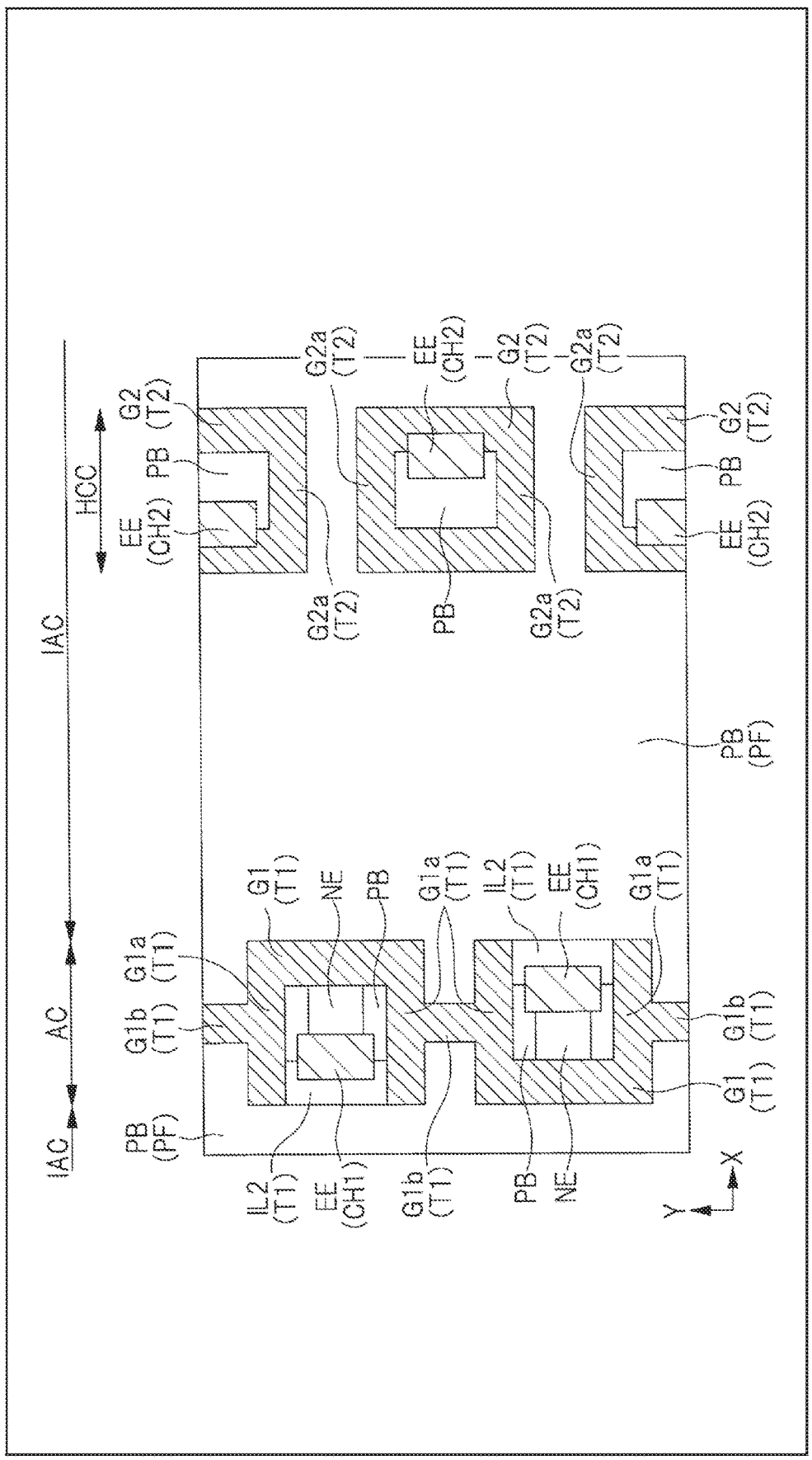
FIG. 24 is a plan view of a main part of a semiconductor device according to a fifth embodiment.

The semiconductor device of fifth embodiment will be described below with reference to FIG. 24. FIG. 24 is a main portion plan view of the semiconductor device of fifth embodiment. In the following explanation, differences from third embodiment and fourth embodiment will be mainly explained.

In the fifth embodiment, two gate electrodes G 1 are connected by two gate connecting portions G 1 so as to surround the contact hole CH1 in which the emitter-potential electrode EE is buried in the active cell area AC. In other words, the emitter region NE is surrounded by an annular trench T 1. The annular trenches T 1 adjacent to each other in the Y direction are connected by a trench T 1 in which a gate connection portion G 1 b is formed. That is, the gate connection portion G 1 b is integrated with the gate electrode G 1 and the gate connection portion G 1 a.

In this manner, by connecting the two gate electrodes G 1 using the gate connection portion G 1 a and the gate connection portion G 1 b, it is possible to suppress an increase in the resistivity of the gate electrode G 1 as in the case of third embodiment.

In the hole collector cell area HCC, two gate electrodes G 2 are connected by two gate connecting portions G 2 so as to surround the contact hole CH2 in which the emitter potential electrode EE is buried. In other words, the base region PB of the hole collector cell region HCC is surrounded by the annular trench T 2. The annular trenches T 2 adjacent to each other in the Y direction are divided by the floating region PF.

As described above, by dividing the hole collector cell region HCC into a plurality of regions and providing the floating region PF therebetween, it is possible to suppress the discharge of holes and further improve the IE effect.

In fifth embodiment, the position of the contact hole CH1 in the active cell region AC and the position of the contact hole CH2 in the hole collector cell region HCC are staggered. Therefore, the entrance and exit of electrons and holes can be dispersed, so that the thermal breakdown resistance can be improved.

It should be noted that the fifth embodiment technique can also be applied to the semiconductor device of second embodiment described above.

Figure 25:
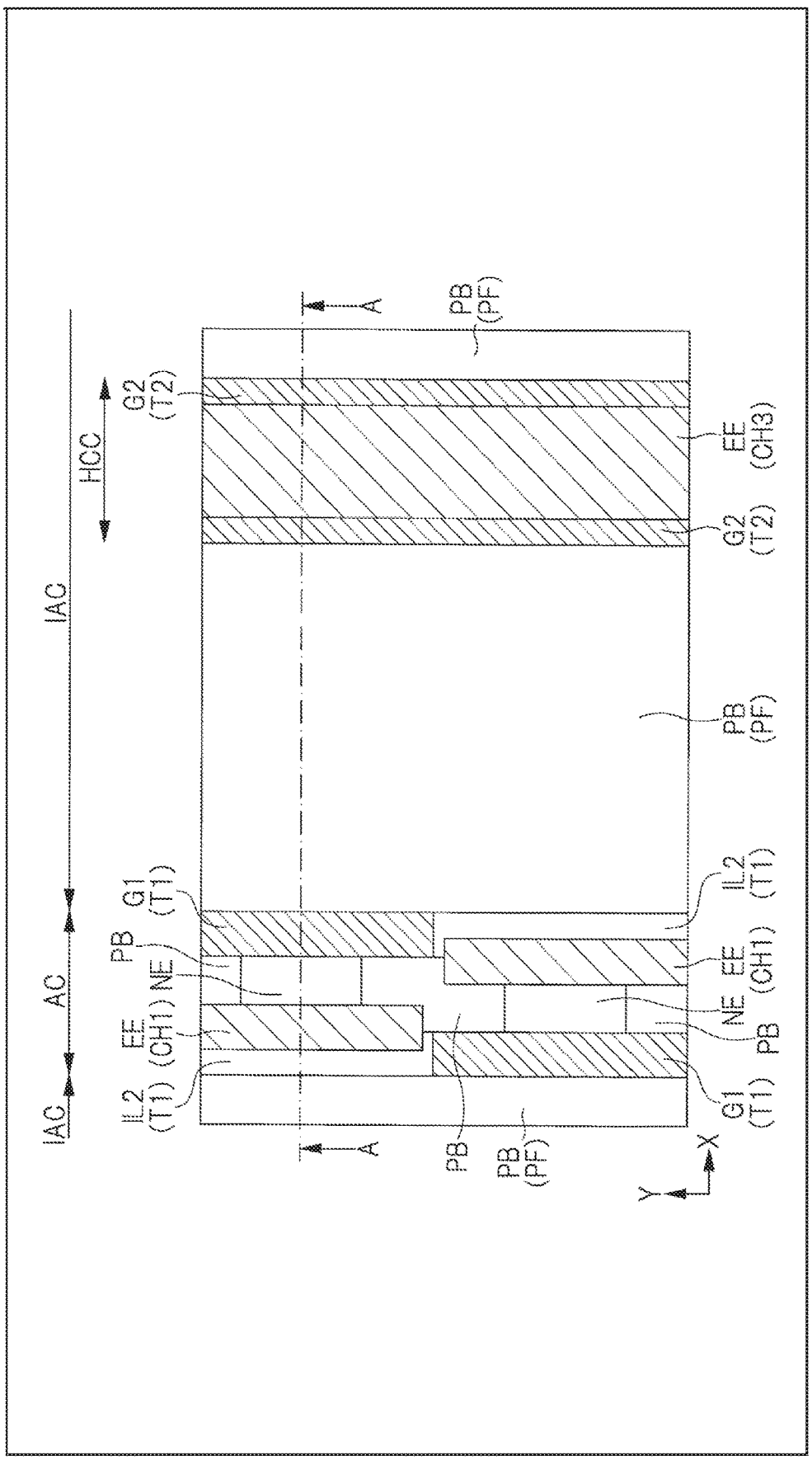
FIG. 25 is a plan view of a main part of a semiconductor device according to a sixth embodiment.
Figure 26:
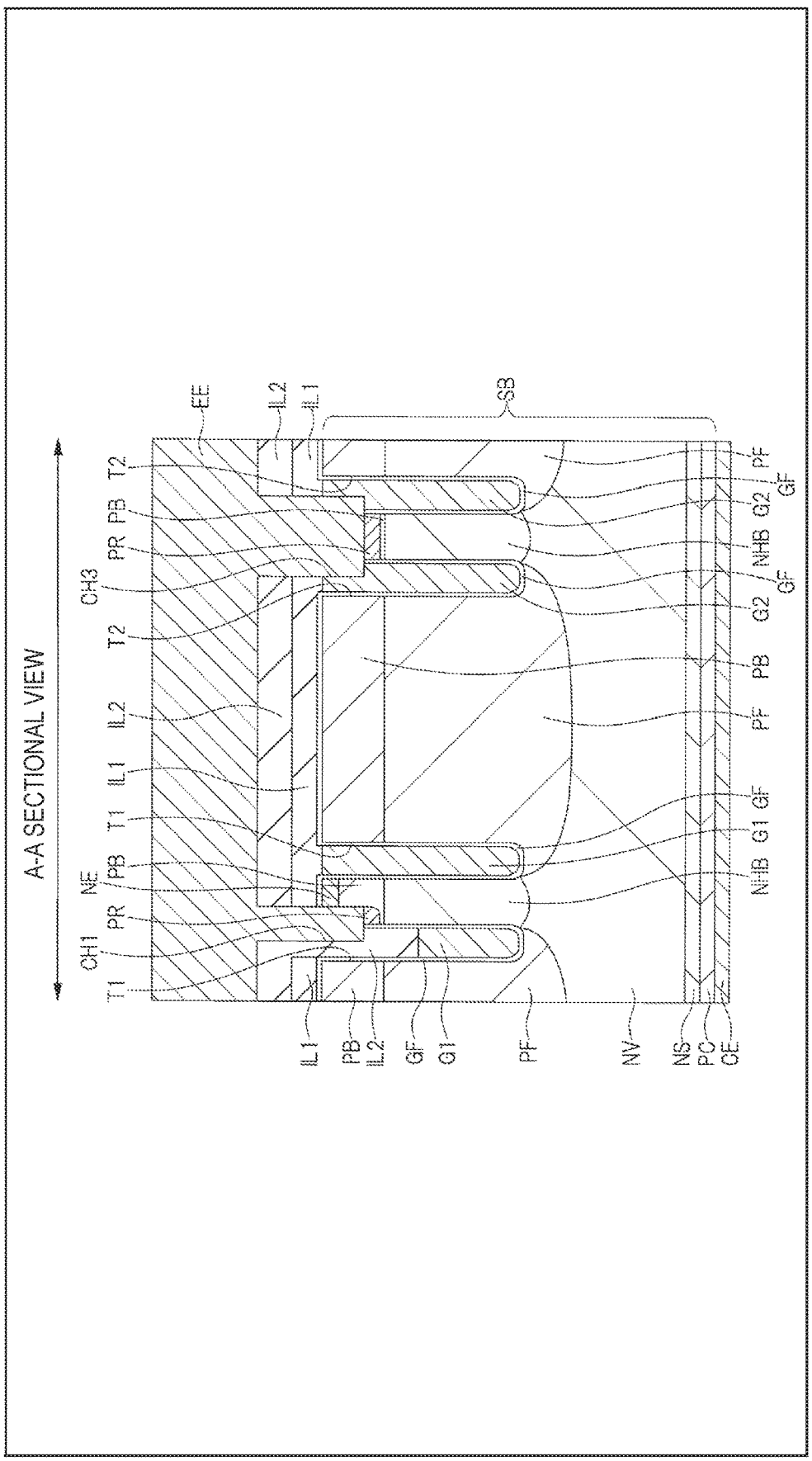
FIG. 26 is a cross-sectional view of a main part of the semiconductor device according to the sixth embodiment.

Hereinafter, the semiconductor device of Embodiment 6 will be described with reference to FIGS. 25 and 26. FIG. 25 is a main portion plan view of the semiconductor device of the sixth embodiment, and FIG. 26 is a cross-sectional view along the line A-A shown in FIG. 25. In the following explanation, differences from first embodiment will be mainly explained.

In the hole collector cell area HCC of the sixth embodiment, instead of the contact hole CH2, a contact hole CH3 wider than the contact hole CH2 is formed in the hole collector cell area HCC. The contact hole CH3 is formed so as to straddle the two gate electrodes G 2 and the body region PR between the two gate electrodes G 2. Therefore, the emitter potential electrode EE is connected to the two gate electrodes G 2 and the body region PR between the two gate electrodes G 2.

Even if such a hole collector cell region HCC is applied to the semiconductor device of the sixth embodiment, the same effects as those of first embodiment can be obtained in the active cell region AC.

The technique of Embodiment 6 can also be applied to the semiconductor device of second embodiment and 3 described above.

Figure 27:
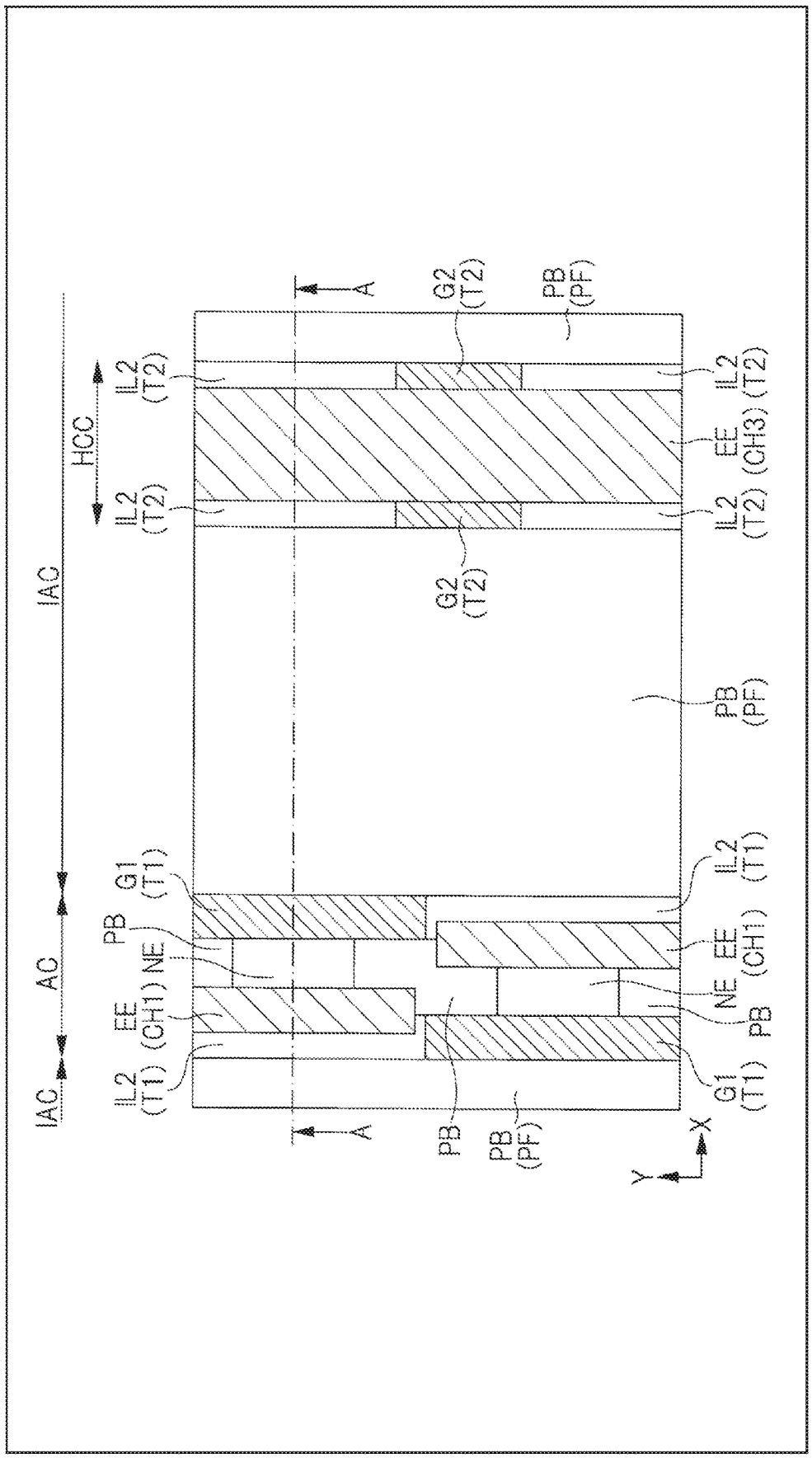
FIG. 27 is a plan view of a main part of a semiconductor device according to a seventh embodiment.
Figure 28:
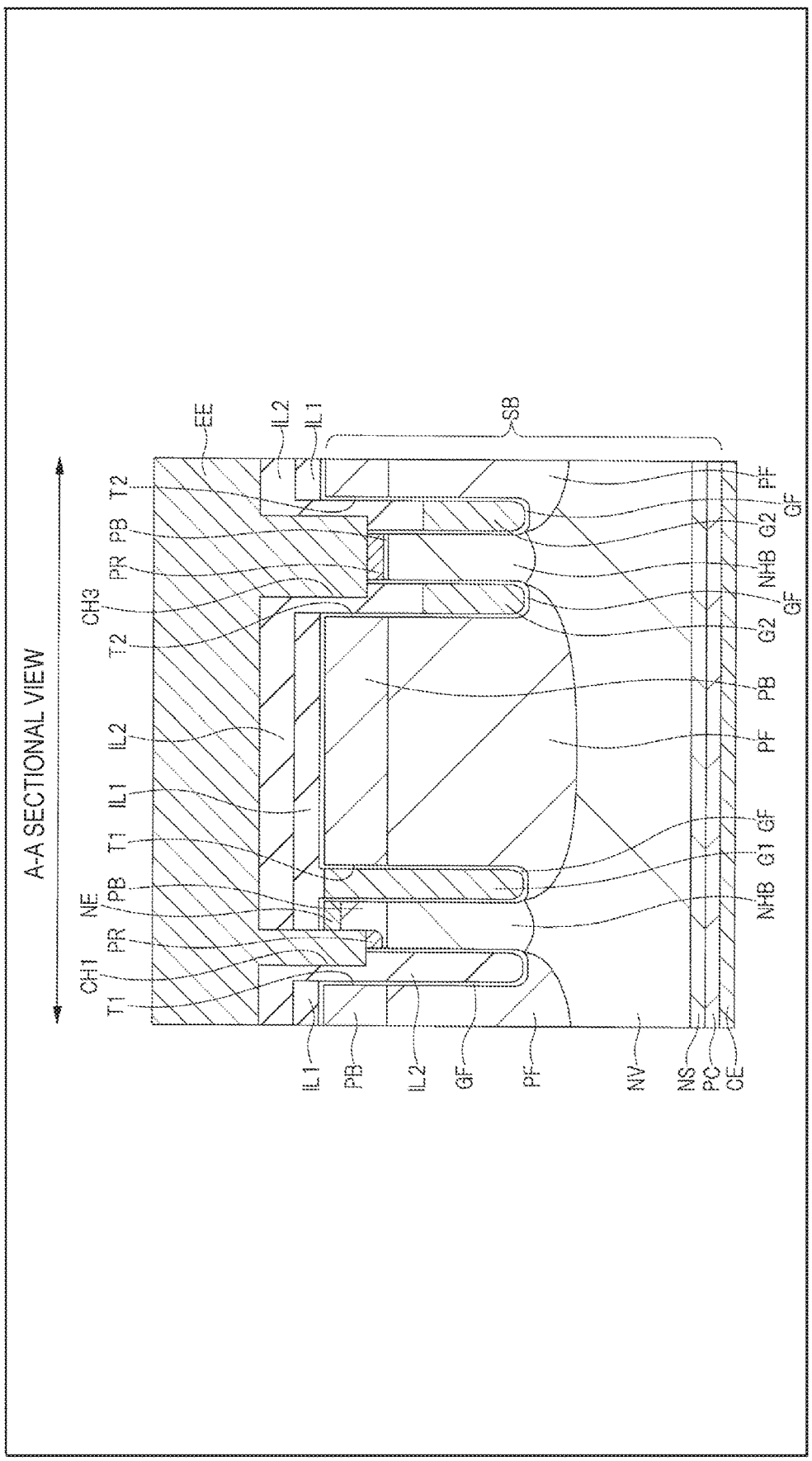
FIG. 28 is a cross-sectional view of a main part of the semiconductor device according to the seventh embodiment.

Hereinafter, the semiconductor device of Embodiment 7 will be described with reference to FIGS. 27 and 28. FIG. 27 is a main portion plan view of the semiconductor device of the seventh embodiment, and FIG. 28 is a cross-sectional view along the line A-A shown in FIG. 27. In the following description, differences from the sixth embodiment will be mainly described.

In the seventh embodiment, the upper surface of the gate electrode G 2 is recessed in a part of the hole collector cell region HCC, and the interlayer insulating film IL2 is buried in the upper portion of the trench T 2.

As described above, when shrinkage is performed as in the semiconductor device of the present application, trench densities per chip-unit area increase, and the Cies of input capacitance increases. Here, as in the seventh embodiment, the gate-emitter capacitance Cge can be reduced and the input capacitance Cies can be reduced by also receding the upper surface of the gate electrode G 2 electrically connected to the emitter potential electrode EE.

FIG. 28 shows a configuration in which all of the gate electrodes G 1 in the trench T 1 are removed, which is described in the first modified example of first embodiment. In the graphs of FIG. 16, it has been explained that the input capacitance Cies can be reduced most when all the gate electrodes G 1 in the trench T 1 are removed. The configuration of FIG. 28 of the seventh embodiment can further reduce the input capacitance Cies compared to the solid line of FIG. 16, and therefore, the switching characteristics can be improved.

In the seventh embodiment, the upper surface of the gate electrode G 2 is made to recede, whereby the IE effect can be further improved and the on-voltage Vc can be reduced. That is, since the upper surface of the gate electrode G 2 is separated from the base region PB, the parasitic p-type MOSFET operation is difficult to perform.

As described in the first embodiment first modified example, the structure in which all of the gate electrodes G1 in the trench T1 were removed had a weak effect on the low voltage of the on-voltage Vc. However, using the technique of the 7th embodiment, it is possible to achieve both an improvement in switching characteristics and a reduction in the on-voltage Vc.

The technique of the seventh embodiment can also be applied to the semiconductor device of the above-mentioned second embodiment to 5.

Figure 29:
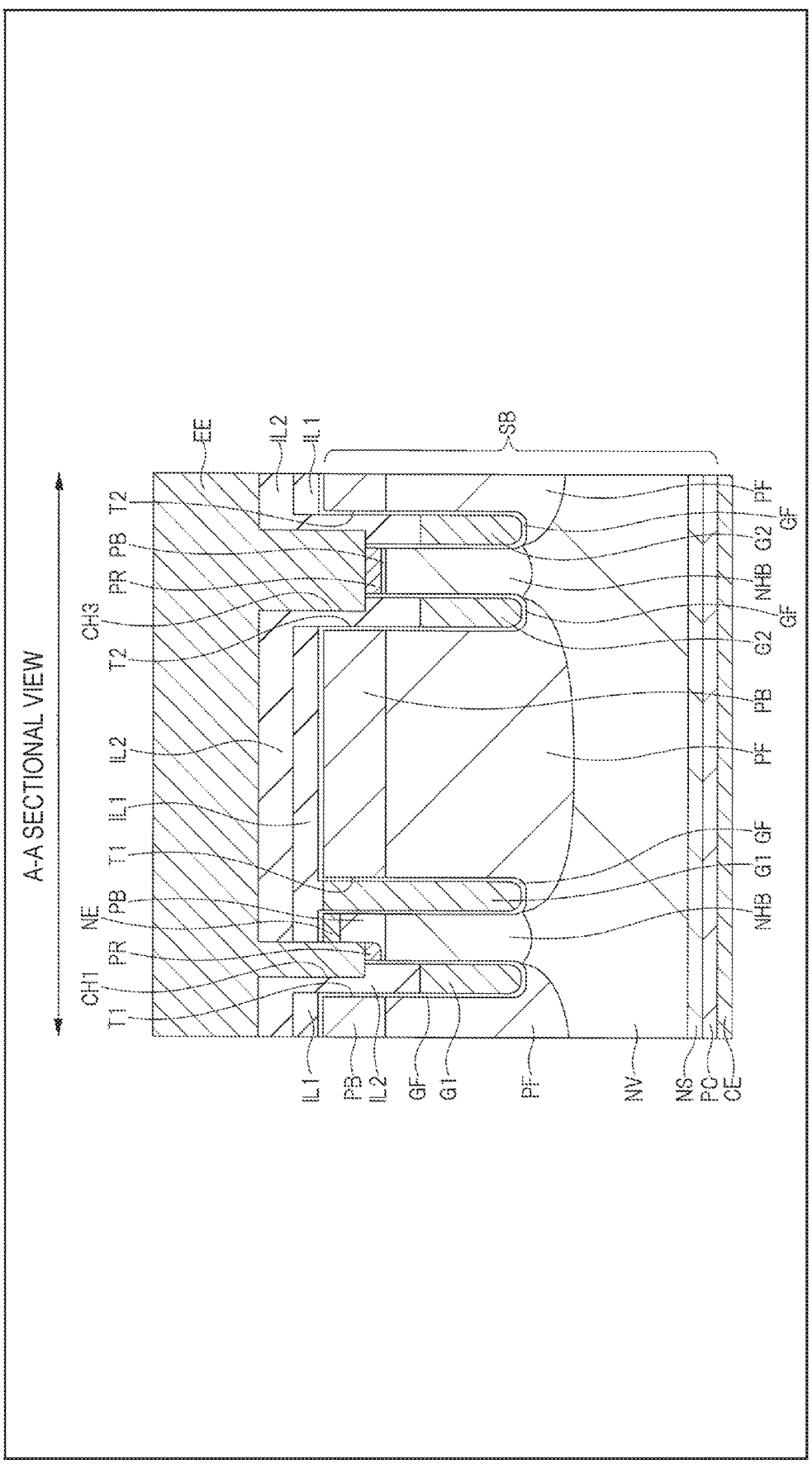
FIG. 29 is a cross-sectional view of a semiconductor device according to an eighth embodiment.

Hereinafter, the semiconductor device of Embodiment 8 will be described with reference to FIG. 29. FIG. 29 is a cross-sectional view of the semiconductor device of the eighth embodiment, and is a cross-sectional view along the line A-A shown in FIG. 27. In the following description, differences from Embodiment Mode 7 will be mainly described.

In the eighth embodiment, the position of the lower surface of the interlayer insulating film IL2 formed in the trench T 1 is the same as the position of the lower surface of the interlayer insulating film IL2 formed in the trench T 2. In other words, the position of the upper surface of the gate electrode G 1 receding in the trench T 1 is the same as the position of the upper surface of the gate electrode G 2 receding in the trench T 2.

Such a structure is obtained by receding the gate electrode G 2 when the gate electrode G 1 is receded in the step of FIG. 12. Then, the gate electrode G 1 and the gate electrode G 2 are retreated in the same process, whereby the manufacturing process can be simplified.

Figure 30:
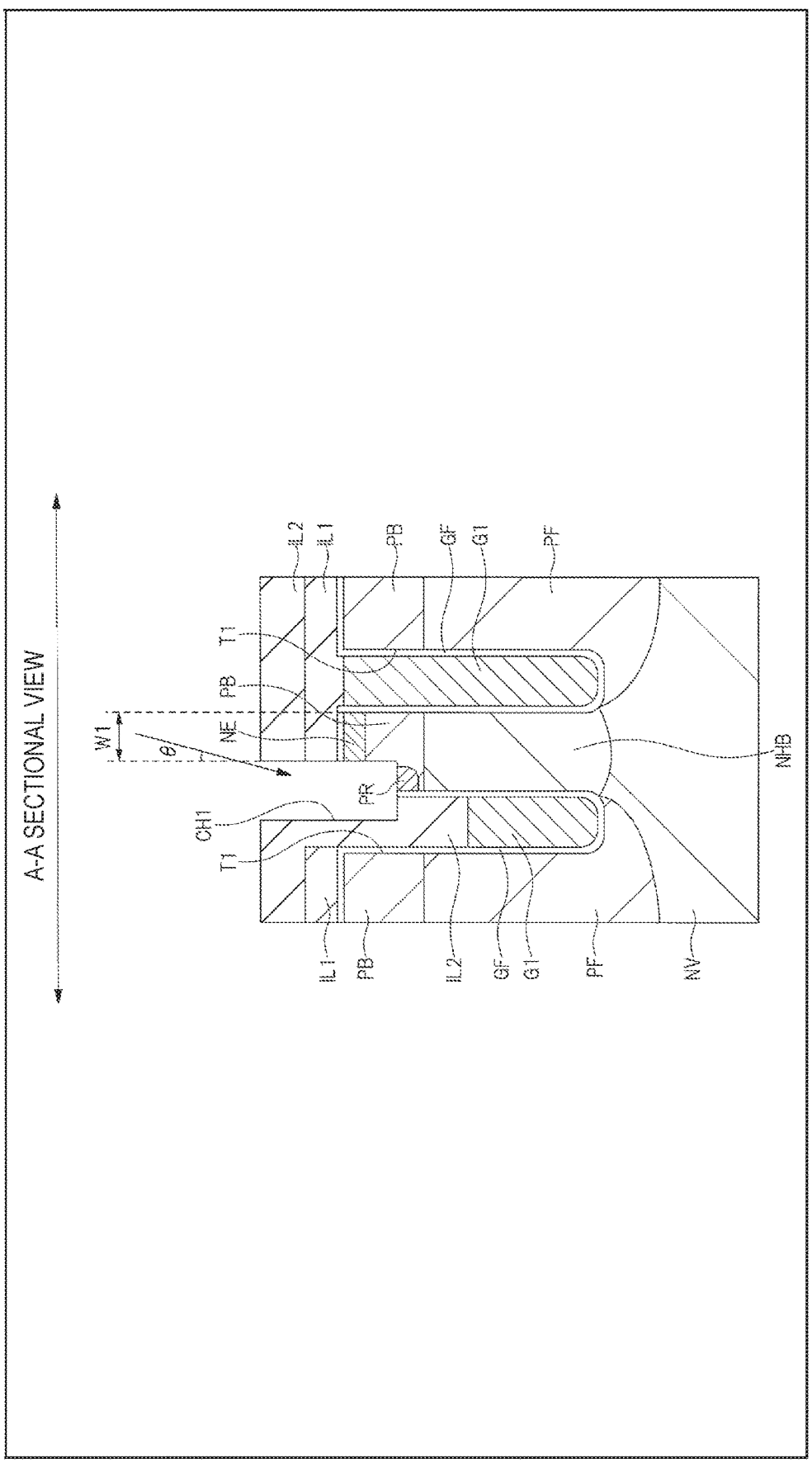
FIG. 30 is a cross-sectional view of a semiconductor device according to embodiment 9.

Hereinafter, the semiconductor device of Embodiment 9 will be described with reference to FIG. 30. FIG. 30 is a cross-sectional view during the manufacturing process of the semiconductor device of the ninth embodiment, and is a cross-sectional view corresponding to the process of forming the body regions PRs of FIG. 14. In the following explanation, differences from first embodiment will be mainly explained.

The body region PR is formed in the base region PB by ion implantation, but if the body region PR is diffused excessively by subsequent heat treatment, the impurity profile of the base region PB may be changed and the operation of the IGBT may be affected. In particular, since the base region PB close to the gate electrode G 1 is a channel region, it is preferable that the change in the impurity profile in this region is small.

In order to prevent such a fear, it is effective to separate the base region PB close to the gate electrode G 1 from the body region PR. For example, it is effective to set the width W 1 of the emitter region NE to 0.1 μm or more, preferably 0.2 μm or more. In other words, the distance W 1 from the end of the contact hole CH1 to the trench T 1 which does not overlap with the contact hole CH1 in plan view is 0.1 μm or more, preferably 0.2 μm or more. As a result, it is possible to suppress a change in the impurity profile in the base region PB near the gate electrode G 1.

As another method, it is effective to form the body region PR by oblique ion implantation. For example, the ion implantation is performed at an angle θ inclined from a perpendicular line to the semiconductor substrate SB toward the trench T 1 in which the interlayer insulating film IL2 is formed to the trench T 1 in which the interlayer insulating film IL2 is not formed. The angle θ is set to a range larger than 0 degrees and smaller than 20 degrees.

In addition, when oblique ion implantation is performed under the contact hole CH1 of the first portion (upper side of the drawing) of the two contact holes CH1 shown in FIG. 2, the contact hole CH1 of the second portion (lower side of the drawing) is covered with the resist film. Conversely, when oblique ion implantation is performed under the contact hole CH1 of the second portion (the lower side of the paper surface), the contact hole CH1 of the first portion (the upper side of the paper surface) is covered with the resist film.

In this manner, the body regions P R can be formed so as not to affect the operation of the IGBT.

The technique of Embodiment 9 can also be applied to the semiconductor device of second embodiment to 8 described above.

Although the invention made by the inventor of the present application has been specifically described based on the embodiment, the present invention is not limited to the above embodiment, and various modifications can be made without departing from the gist thereof.

AC CHP Electrode Contact Cell Area CE AC Active Cell Potential Contact Potential Electrode Emitter Potential EEP Emitter Pad FG Conductive Membrane G1, G 1b, GE gate electrode G 1a, IL2, G 2 a gate connection GE gate potential GF gate dielectric film GF gate pad guard ring HCC hole region IAC active cell region IF1 insulating film IL', CH1~CH3 interlayer insulating film NE Hall region NHB barrier region NS field stop region NV drift region PB base region PC region PF floating region PF Body region SB semiconductor substrate T1, T2 trench VO cavity.

What is claimed is:

1. A semiconductor device comprising:
a first trench and a second trench formed in a semiconductor substrate, the first trench and the second trench extending in a first direction in a plan view and facing each other in a second direction perpendicular to the first direction in the plan view;
a first base region of a first conductivity type formed in the semiconductor substrate and located between the first trench and the second trench;
a first emitter region of a second conductivity type opposed to the first conductivity type being formed in the first base region;
a first contact hole formed on the first base region; and
an emitter potential electrode formed in the first contact hole and in contact with the first emitter region and the first base region,
wherein a first gate electrode electrically connected to a gate potential is formed in the first trench,
wherein an insulating film is formed in the second trench,
wherein the first contact hole is formed at a position overlapping the second trench in the plan view, and
wherein a bottom portion of the first contact hole is located on a first insulating layer in the second trench and is located on the first base region.

2. The semiconductor device according to claim 1,
wherein the first insulating film is formed in an upper portion of the second trench,
wherein a second gate electrode electrically connected to the gate potential is formed in a lower portion of the second trench, and
wherein the first insulating film is formed to a position deeper than the first base region.

3. The semiconductor device according to claim 1, wherein the first insulating film is formed entirely in the second trench.

4. The semiconductor device according to claim 1, wherein a cavity is formed in the first insulating film in the second trench.

5. The semiconductor device according to claim 1,
wherein each of the first trench and the second trench extends in a first location and a second location different from the first location in the first direction,
wherein the first contact hole is formed in the first location and a second contact hole is formed in the second location, wherein a second insulating film is formed in the first trench in the second location and a second electrode electrically connected to the gate potential is formed in the second trench in the second location, and
wherein a bottom portion of the second contact hole is located on a second insulating layer in the first trench in the second location.

6. The semiconductor device according to claim 5, wherein a first gate connecting portion for connecting the first gate electrode in the first location and the second gate electrode in the second location is formed between the first and second locations.

7. A method of manufacturing a semiconductor device comprising the steps of:
(a) forming a first trench and a second trench in a semiconductor substrate, the first trench and the second trench extending in a first direction in a plan view and facing each other in a second direction perpendicular to the first direction in the plan view;
(b) forming a first base region of a first conductivity type in the semiconductor substrate to locate between the first trench and the second trench in the plan view;
(c) forming a first emitter region of a second conductivity type opposed to the first conductivity type in the first base region;
(d) forming a first contact hole on the first base region;
(e) forming an emitter potential electrode in the first contact hole to be in contact with the first emitter region and the first base region;
(f) forming a first gate electrode electrically connected to a gate potential in the first trench; and
(g) forming an insulating film in the second trench,
wherein the first contact hole is formed at a position overlapping the second trench in the plan view, and
wherein a bottom portion of the first contact hole is located on a first insulating layer in the second trench and is located on the first base region.

* * * * *